US012757400B2

(12) United States Patent
Su

(10) Patent No.: US 12,757,400 B2
(45) Date of Patent: Oct. 6, 2026

(54) 3D MEMORY WITH REDUCED LEAKAGE CURRENT

(71) Applicant: MACRONIX International Co., Ltd., Hsinchu (TW)

(72) Inventor: Yan-Ru Su, Chiayi County (TW)

(73) Assignee: MACRONIX International Co., Ltd., Hsinchu (TW)

(*) Notice: Subject to any disclaimer, the term of this patent is extended or adjusted under 35 U.S.C. 154(b) by 366 days.

(21) Appl. No.: 18/608,930

(22) Filed: Mar. 19, 2024

(65) Prior Publication Data

US 2025/0301639 A1 Sep. 25, 2025

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 43/27; H10B 41/27; H10B 43/10; H10B 43/20; H10B 41/35; H10B 41/20; H10B 43/35
See application file for complete search history.

(56) References Cited

U.S. PATENT DOCUMENTS 9,418,743 B1 * 8/2016 Chen ...................... H10B 43/27
2020/0075617 A1 * 3/2020 Saxler .................... H10D 84/01
2021/0074726 A1 * 3/2021 Lue ........................ H10B 51/30
2021/0375872 A1 12/2021 Ahn
2021/0391351 A1 * 12/2021 Takimoto ............... H10B 41/10
2022/0246195 A1 * 8/2022 Hsu .......................... G11C 5/06
2022/0359564 A1 11/2022 Oh et al.
2024/0127889 A1 * 4/2024 Widjaja ............... H10D 30/681
2025/0081465 A1 * 3/2025 Kutsukake ............. H10B 43/35

FOREIGN PATENT DOCUMENTS

TW 202335323 9/2023
TW 202349661 12/2023

OTHER PUBLICATIONS

"Office Action of Taiwan Counterpart Application", issued on Dec. 27, 2024, p. 1-p. 3.

* cited by examiner

*Primary Examiner* — J. E. Schoenholtz
(74) *Attorney, Agent, or Firm* — J.C. PATENTS

(57) ABSTRACT

A memory device includes a stacked structure, a first conductive type doping layer, a second conductive type doping layer, a first conductive plug and a second conductive plug. The stacked structure is located above the substrate, and includes a plurality of conductive layers and a plurality of insulating layers alternately stacked. A projection area of the first conductive type doping layer is larger than a projection area of the stacked structure. The second conductive type doping layer surrounds the first conductive type doping layer and forms a hetero-junction with the first conductive type doping layer. The first conductive plug is electrically connected to the first conductive type doping layer. The second conductive plug is electrically connected to the second conductive type doping layer. The memory device may be a 3D AND flash memory.

18 Claims, 22 Drawing Sheets

3D MEMORY WITH REDUCED LEAKAGE CURRENT

BACKGROUND

Technical Field

The embodiments of the present disclosure relate to a semiconductor device and a method of fabricating the same, and particularly to a memory device and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR memory and a NAND memory. In addition, another type of 3D memory is an AND memory, which may be applied to a multi-dimensional memory array with high integration and high area utilization, and has an advantage of a fast operation speed. Therefore, the development of a 3D memory device has gradually become the current trend. However, there are still many challenges associated with the 3D memory device.

SUMMARY

The embodiments of the present disclosure provide a memory device and a method of fabricating the same in which a leakage current of a memory may be reduced.

In an embodiment of the present disclosure, a memory device includes a stacked structure, a first conductive type doping layer, a second conductive type doping layer, a first conductive plug and a second conductive plug. The stacked structure is located above the substrate, and includes a plurality of conductive layers and a plurality of insulating layers alternately stacked. The first conductive type doping layer is located between the stacked structure and the substrate, and a projection area of the first conductive type doping layer is larger than a projection area of the stacked structure. The second conductive type doping layer surrounds the first conductive type doping layer and forms a hetero-junction with the first conductive type doping layer. The first conductive plug is electrically connected to the first conductive type doping layer. The second conductive plug is electrically connected to the second conductive type doping layer.

In an embodiment of the present disclosure, a memory device includes a first conductive type doping layer, a second conductive type doping layer, a stacked structure, a first middle separation wall, a second middle separation wall, a first outer separation wall and a second outer separation wall. The first conductive type doping layer is located above a substrate and includes a first portion and a second portion separated from each other. The second conductive type doping layer is located above the substrate, and forms a first hetero-junction with the first portion and a second hetero-junction with the second portion. The second conductive type doping layer includes a middle portion and a peripheral portion. The middle portion is located between the first portion and the second portion of the first conductive type doping layer. The peripheral portion surrounds the first portion and the second portion of the first conductive type doping layer. The stacked structure is located above the first portion of the first conductive type doping layer, above the middle portion of the second conductive type doping layer, and above the second portion of the first conductive type doping layer. The stacked structure includes a plurality of conductive layers and a plurality of insulating layers alternately stacked. The first middle separation wall extends through the stacked structure and is located between the first portion of the first conductive type doping layer and the middle portion of the second conductive type doping layer. The second middle separation wall extends through the stacked structure and is located between the second portion of the first conductive type doping layer and the middle portion of the second conductive type doping layer. The first outer separation wall extends through the stacked structure and extends to the first portion of the first conductive type doping layer and the peripheral portion of the second conductive type doping layer. The second outer separation wall extends through the stacked structure and extends to the second portion of the first conductive type doping layer and the peripheral portion of the second conductive type doping layer. The first outer separation wall and the first middle separation wall define a first tile of the stacked structure, and the second outer separation wall and the second middle separation wall define a second tile of the stacked structure.

In view of the above, in the memory device and its fabricating method according to the embodiments of the present disclosure, a hetero-junction of the first conductive type doping layer and the second conductive type doping layer is formed and is non-conductive by applying and controlling a voltage thereto, so that a leakage current may be reduced.

DESCRIPTION OF THE EMBODIMENTS

Figure 1A:
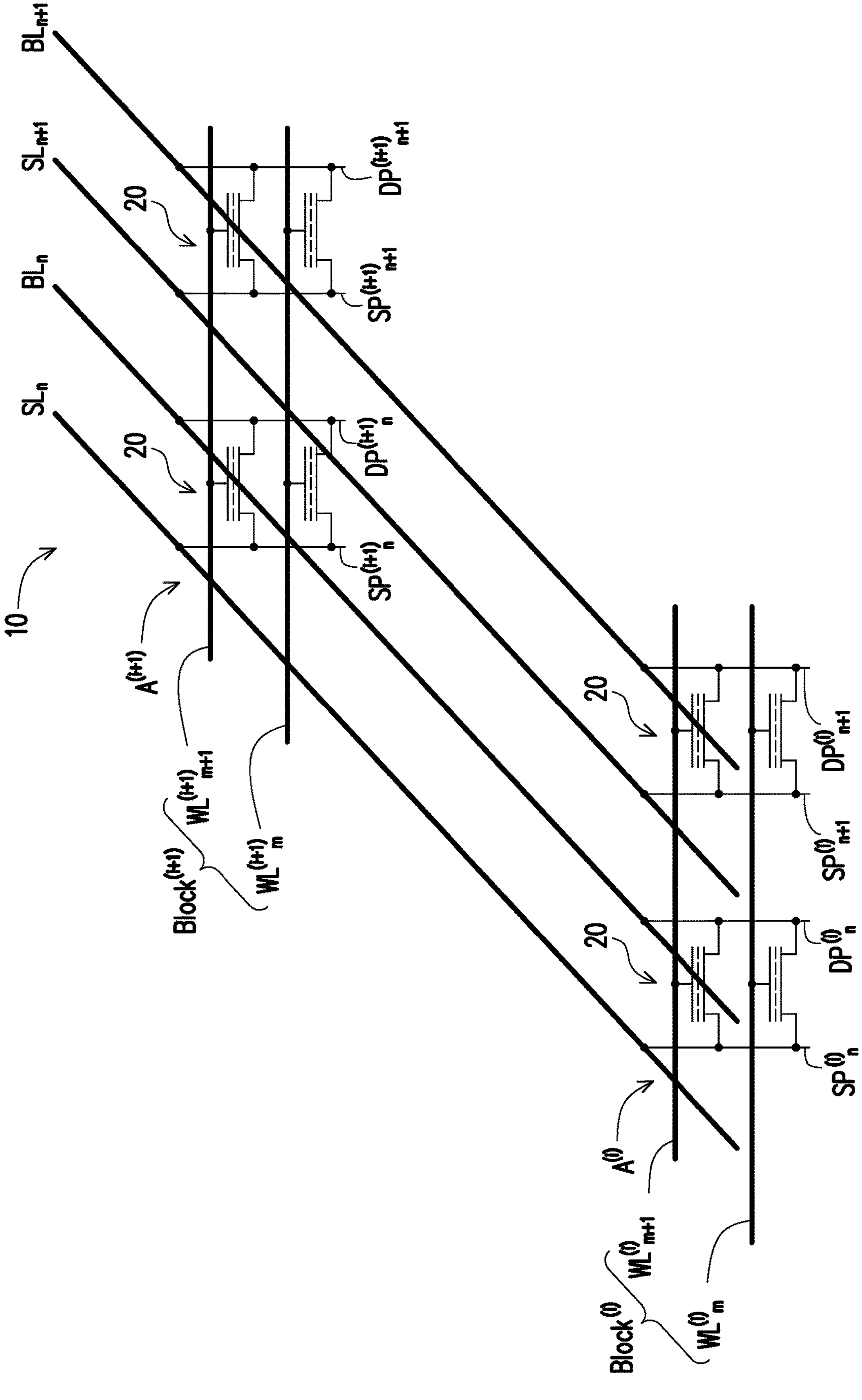
FIG. 1A is a circuit diagram of a 3D AND flash memory array according to some embodiments.
Figure 1B:
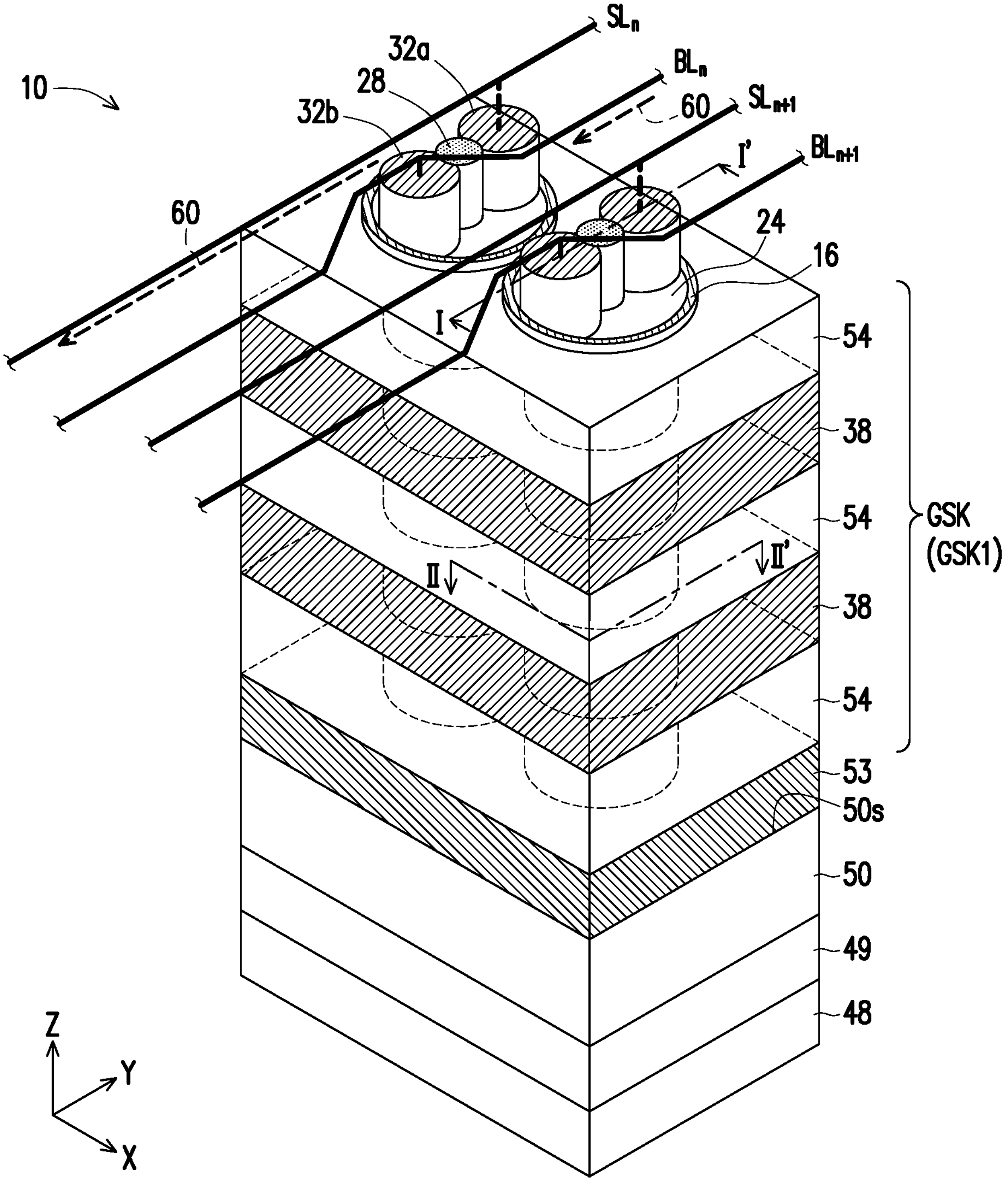
FIG. 1B is a partial perspective view of a part of the memory array in FIG. 1A.

FIG. 1A is a circuit diagram of a 3D AND flash memory array according to some embodiments. FIG. 1B is a partial perspective view of a part of the memory array in FIG. 1A.

Figure 1C:
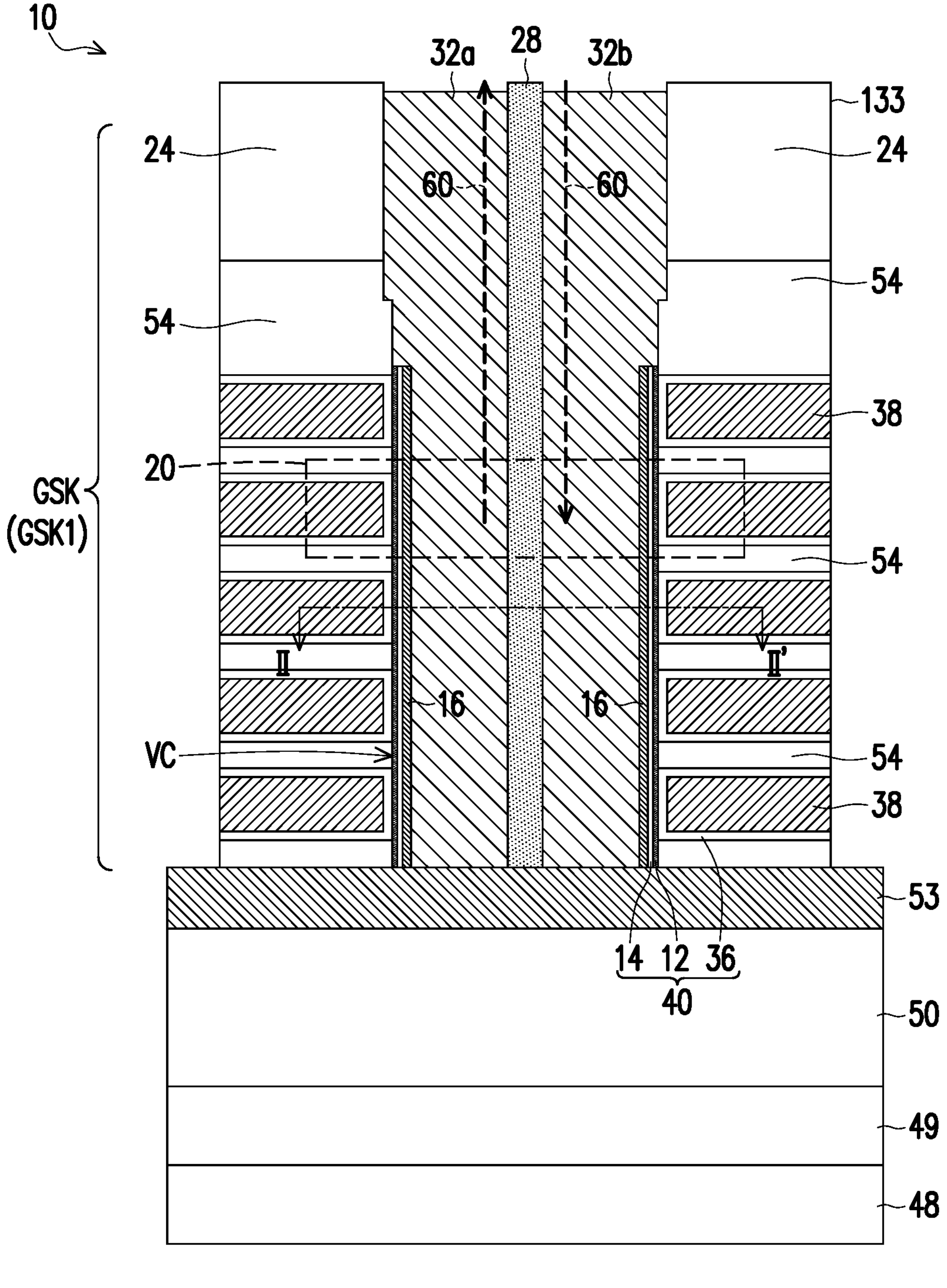
FIG. 1C and FIG. 1D are cross-sectional views taken along the line I-I' of FIG. 1B.
Figure 1D:
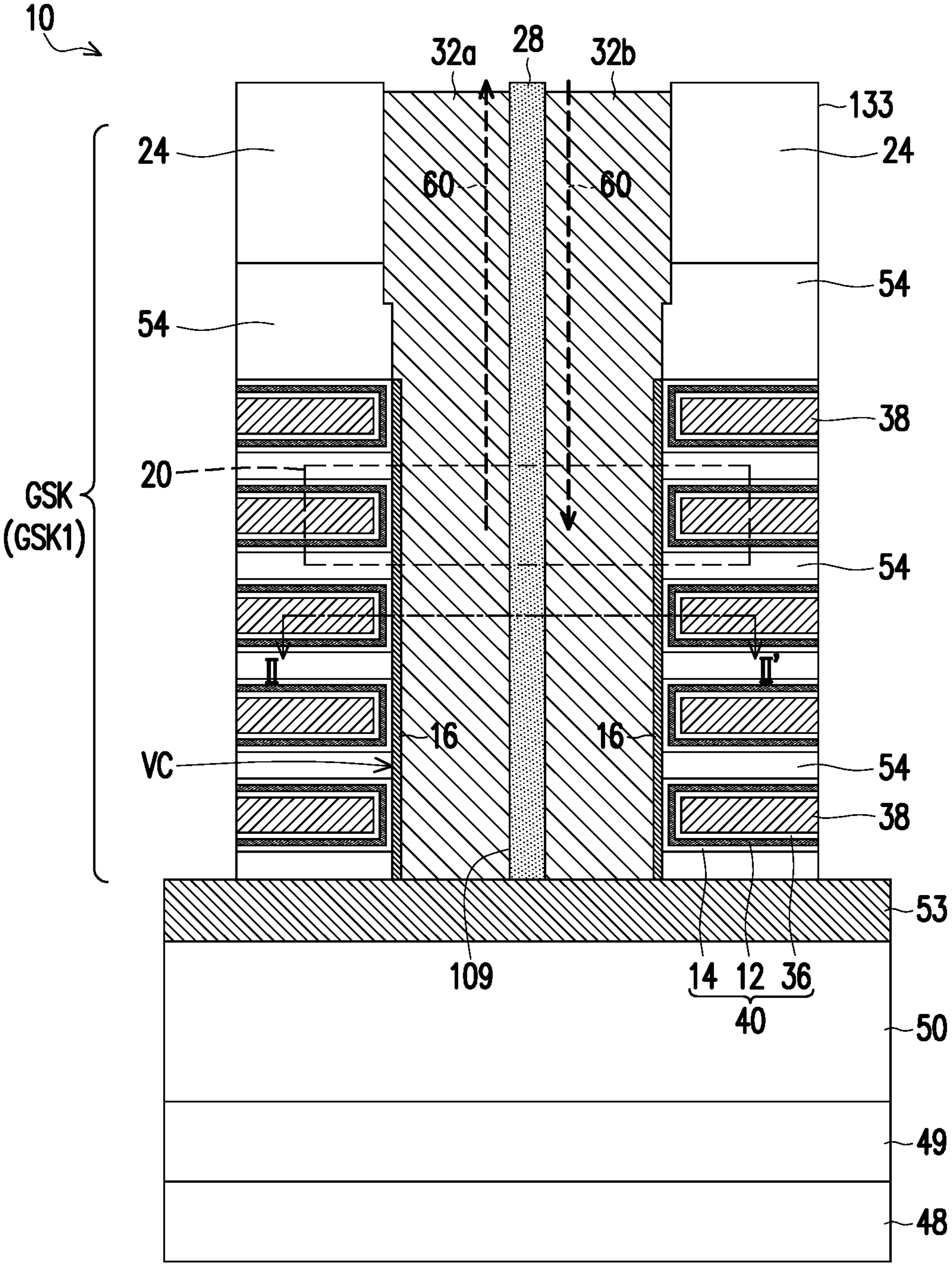
Figure 1E:
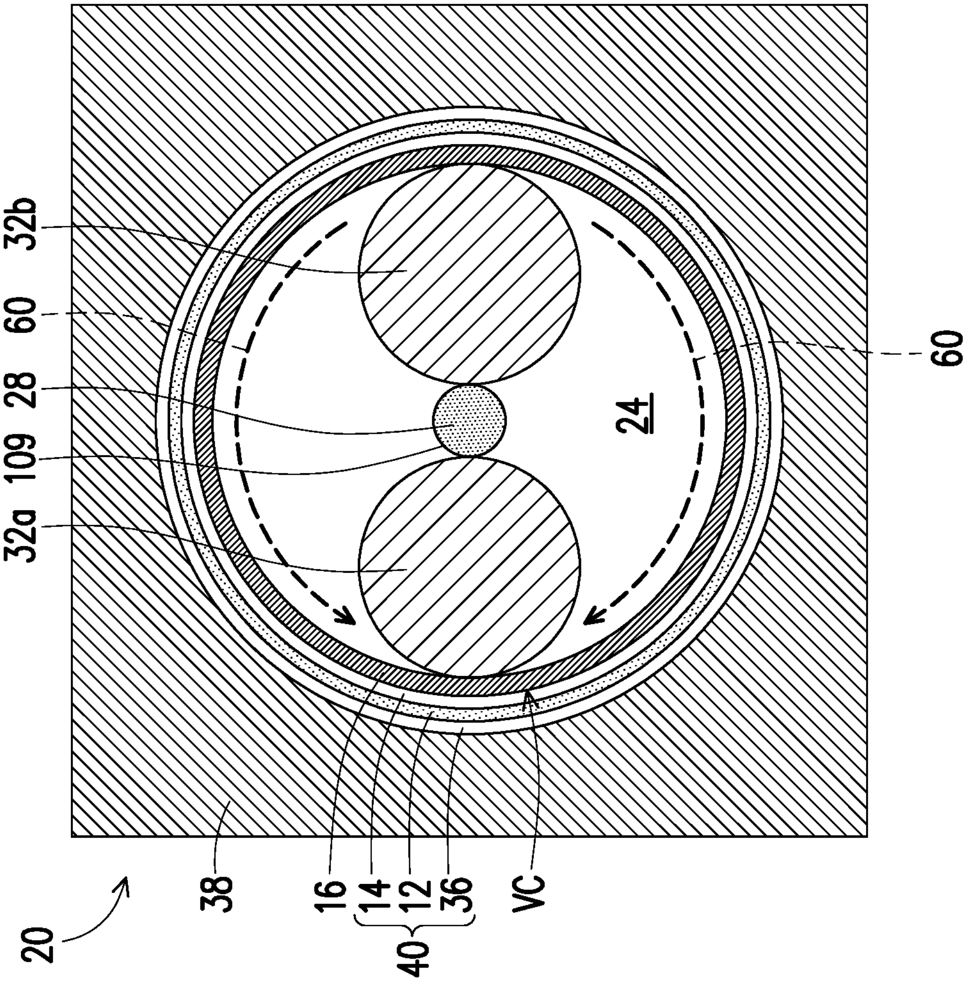
FIG. 1E is a top view of the line II-II' of FIG. 1B, FIG. 1C and FIG. 1D.

FIG. 1C and FIG. 1D are cross-sectional views taken along line I-I' of FIG. 1B. FIG. 1E is a top view of line II-II' of FIG. 1B, FIG. 1C and FIG. 1D.

FIG. 1A is a schematic view of two blocks $BLOCK^{(i)}$ and $BLOCK^{(i+1)}$ of a vertical AND memory array 10 arranged in rows and columns. The block $BLOCK^{(i)}$ includes a memory array $A^{(i)}$. A row (e.g., an $(m+1)^{th}$ row) of the memory array $A^{(i)}$ is a set of AND memory cells 20 having a common word line (e.g., $WL^{(i)}_{m+1}$). The AND memory cells 20 of the memory array $A^{(i)}$ in each row (e.g., the $(m+1)^{th}$ row) correspond to a common word line (e.g., $WL^{(i)}_{m+1}$) and are coupled to different source pillars (e.g., $SP^{(i)}_{n}$ and $SP^{(i)}_{n+1}$) and drain pillars (e.g., $DP^{(i)}_{n}$ and $DP^{(i)}_{n+1}$), so that the AND memory cells 20 are logically arranged in a row along the common word line (e.g., $WL^{(i)}_{m+1}$).

A column (e.g., an $n^{th}$ column) of the memory array $A^{(i)}$ is a set of AND memory cells having a common source pillar (e.g., $SP^{(i)}_{n}$) and a common drain pillar (e.g., $DP^{(i)}_{n}$). The AND memory cells 20 of the memory array $A^{(i)}$ in each column (e.g., the $n^{th}$ column) correspond to different word lines (e.g., $WL^{(i)}_{m+1}$ and $WL^{(i)}_{m}$) and are coupled to a common source pillar (e.g., $SP^{(i)}_{n}$) and a common drain pillar (e.g., $DP^{(i)}_{n}$). Hence, the AND memory cells 20 of the memory array $A^{(i)}$ are logically arranged in a column along the common source pillar (e.g., $SP^{(i)}_{n}$) and the common drain pillar (e.g., $DP^{(i)}_{n}$). In the physical layout, according to the fabrication method as applied, the columns or rows may be twisted and arranged in a honeycomb pattern or other patterns for high density or other reasons.

In FIG. 1A, in the block $BLOCK^{(i)}$, the AND memory cells 20 in the $n^{th}$ column of the memory array $A^{(i)}$ share a common source pillar (e.g., $S^{(i)P}_{n}$) and a common drain pillar (e.g., $DP^{(i)}_{n}$). The AND memory cells 20 in an $(n+1)^{th}$ column share a common source pillar (e.g., $SP^{(i)}_{n+1}$) and a common drain pillar (e.g., $DP^{(i)}_{n+1}$).

The common source pillar (e.g., $SP^{(i)}_{n}$) is coupled to a common source line (e.g., $SL_{n}$) and the common drain pillar (e.g., $DP^{(i)}_{n}$) is coupled to a common bit line (e.g., $BL_{n}$). The common source pillar (e.g., $SP^{(i)}_{n+1}$) is coupled to a common source line (e.g., $SL_{n+1}$) and the common drain pillar (e.g., $DP^{(i)}_{n+1}$) is coupled to a common bit line (e.g., $BL_{n+1}$).

Likewise, the block $BLOCK^{(i+1)}$ includes a memory array $A^{(i+1)}$, which is similar to the memory array $A^{(i)}$ in the block $BLOCK^{(i)}$. A row (e.g., an $(m+1)^{th}$ row) of the memory array $Al^{(i+1)}$ is a set of AND memory cells 20 having a common word line (e.g., $WL^{(i+1)}_{m+1}$). The AND memory cells 20 of the memory array $A^{(i+1)}$ in each row (e.g., the $(m+1)^{th}$ row) correspond to a common word line (e.g., $WL^{(i+1)}_{m+1}$) and are coupled to different source pillars (e.g., $SP^{(i+1)}_{n}$ and $SP^{(i+1)}_{n+1}$) and drain pillars (e.g., $DP^{(i+1)}_{n}$ and $DP^{(i+1)}_{n+1}$). A column (e.g., an $n^{th}$ column) of the memory array $A^{(i+1)}$ is a set of AND memory cells 20 having a common source pillar (e.g., $SP^{(i+1)}_{n}$) and a common drain pillar (e.g., $DP^{(i+1)}_{n}$). The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_{m}$) and are coupled to a common source pillar (e.g., $SP^{(i+1)}_{n}$) and a common drain pillar (e.g., $DP^{(i+1)}_{n}$). Hence, the AND memory cells 20 of the memory array $A^{(i+1)}$ are logically arranged in a column along the common source pillar (e.g., $SP^{(i+1)}_{n}$) and the common drain pillar (e.g., $DP^{(i+1)}_{n}$).

The block $BLOCK^{(i+1)}$ and the block $BLOCK^{(i)}$ share source lines (e.g., $SL_{n}$ and $SL_{n+1}$) and bit lines (e.g., $BL_{n}$ and $BL_{n+1}$). Therefore, the source line $SL_{n}$ and the bit line $BL_{n}$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array A (i+1) of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B to FIG. 1D, the memory array 10 may be located over an interconnection structure of a semiconductor die, for example, being located on one or more active devices (e.g., transistors) formed on a semiconductor substrate. Therefore, a dielectric substrate (or called dielectric layer) 50 may be a dielectric layer (e.g., a silicon oxide layer) over a metal interconnection structure formed on a silicon substrate. The memory array 10 may include a stacked structure GSK, multiple channel pillars 16, multiple first conductive pillars (also referred to as source pillars) 32*a*, multiple second conductive pillars (also referred to as drain pillars) 32*b*, and multiple charge storage structures 40.

Referring to FIG. 1B, the stacked structure GSK is formed on the dielectric substrate 50. The stacked structure GSK includes multiple gate layers (also referred to as word lines or conductive layers) 38 and multiple insulating layer 54 vertically stacked on a surface 50*s* of the dielectric substrate 50. In a Z direction, the gate layers 38 are electrically isolated from each other by the insulating layer 54 located therebetween. The gate layers 38 extend in a direction parallel to the surface of the dielectric substrate 50. The gate layers 38 in a staircase region SR may have a staircase structure SC. Therefore, a lower gate layer 38 is longer than an upper gate layer 38, and the end of the lower gate layer 38 extends laterally beyond the end of the upper gate layer 38. Contacts (not shown) for connecting the gate layers 38 may be landed on the ends of the gate layers 38 to connect the gate layers 38 respectively to conductive lines.

Referring to FIG. 1B to FIG. 1D, the memory array 10 further includes multiple channel pillars 16. The channel pillars 16 extend continuously in the Z direction through the stacked structure GSK and to the conductive layer 53 between the dielectric substrate 50 and the stacked structure GSK. In some embodiments, each channel pillar 16 may have a ring shape from a top view. The material of the channel pillars 16 may include semiconductor, such as undoped polysilicon. The material of the conductive layer 53 may include doped polysilicon. In some embodiments, the material of the conductive layer 53 may include P-type doped polysilicon and N-type doped polysilicon, which will be described in detail in the following context.

Referring to FIG. 1B to FIG. 1D, the memory array 10 further includes multiple insulating pillars 28, multiple first conductive pillars 32*a*, and multiple second conductive pillars 32*b*. In this example, the first conductive pillars 32*a* serve as source pillars. The second conductive pillars 32*b* serve as drain pillars. The first conductive pillars 32*a*, the second conductive pillars 32*b*, and the insulating pillars 28 each extend in a direction (i.e., the Z direction) perpendicular to the surface (i.e., the X-Y plane) of the gate layer 38. The first conductive pillar 32*a* and the second conductive pillar 32*b* are separated by the insulating pillar 28 and surrounded by an insulating filling layer 24. The first conductive pillar 32*a* and the second conductive pillar 32*b* are electrically connected to the channel pillar 16. The first conductive pillar 32*a* and the second conductive pillar 32*b* may include doped polysilicon or metal materials. The insulating pillar 28 may include silicon nitride or silicon oxide, and the insulating filling layer 24 may include silicon oxide.

Referring to FIG. 1C and FIG. 1D, a charge storage structure 40 is located between the channel pillar 16 and the gate layers (or called conductive layers) 38. The charge storage structure may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (e.g., the tunneling layer 14 and the charge storage layer 12) of the charge storage structure 40 continuously extends in a direction (i.e., the Z direction) perpendicular to the gate layer 38, and another portion (e.g., the blocking layer 36) of the charge storage structure 40 surrounds the gate layer 38. In other embodiments, as shown in FIG. 1D, the charge storage structure 40 (e.g., the tunneling layer 14, the charge storage layer 12, and the blocking layer 36) surrounds the gate layer 38.

Referring to FIG. 1E, the charge storage structure 40, the channel pillar 16, the source pillar 32*a*, and the drain pillar 32*b* are surrounded by the gate layer 38, and a memory cell 20 is accordingly defined. According to different operation methods, a 1-bit operation or a 2-bit operation may be performed on the memory cell 20. For example, when a voltage is applied to the source pillar 32*a* and the drain pillar 32*b*, since the source pillar 32*a* and the drain pillar 32*b* are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32*a* and the drain pillar 32*b*. For an operation involving source side injection, channel-hot-electron injection, or band-to-band tunneling hot carrier injection, electrons or holes may be locally trapped in the charge storage structure 40 adjacent to one of the source pillar 32*a* and the drain pillar 32*b*. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the drain pillar 32*b* from the bit line $BL_n$ or $BL_{n+1}$ (shown in FIG. 1B), flow to the source pillar 32*a* via the turned-on channel region (e.g., in a direction indicated by arrow 60), and finally flow to the source line $SL_n$ or $SL_{n+1}$ (shown in FIG. 1B).

Figures 2A, 2B:
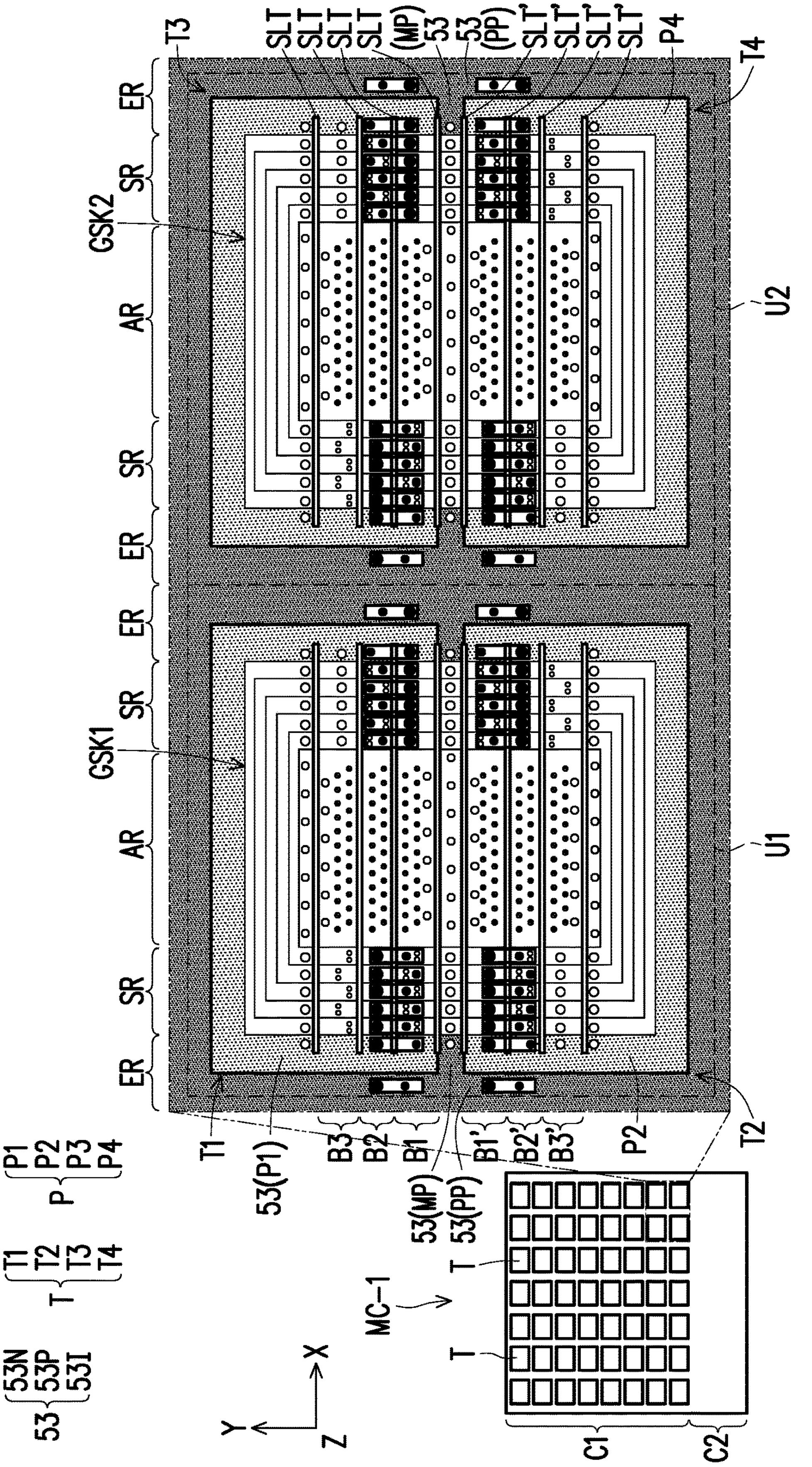
FIG. 2A is a top view of a memory die according to an embodiment of the present disclosure.
FIG. 2B is a top view of a partial area of FIG. 2A.
Figure 2C:
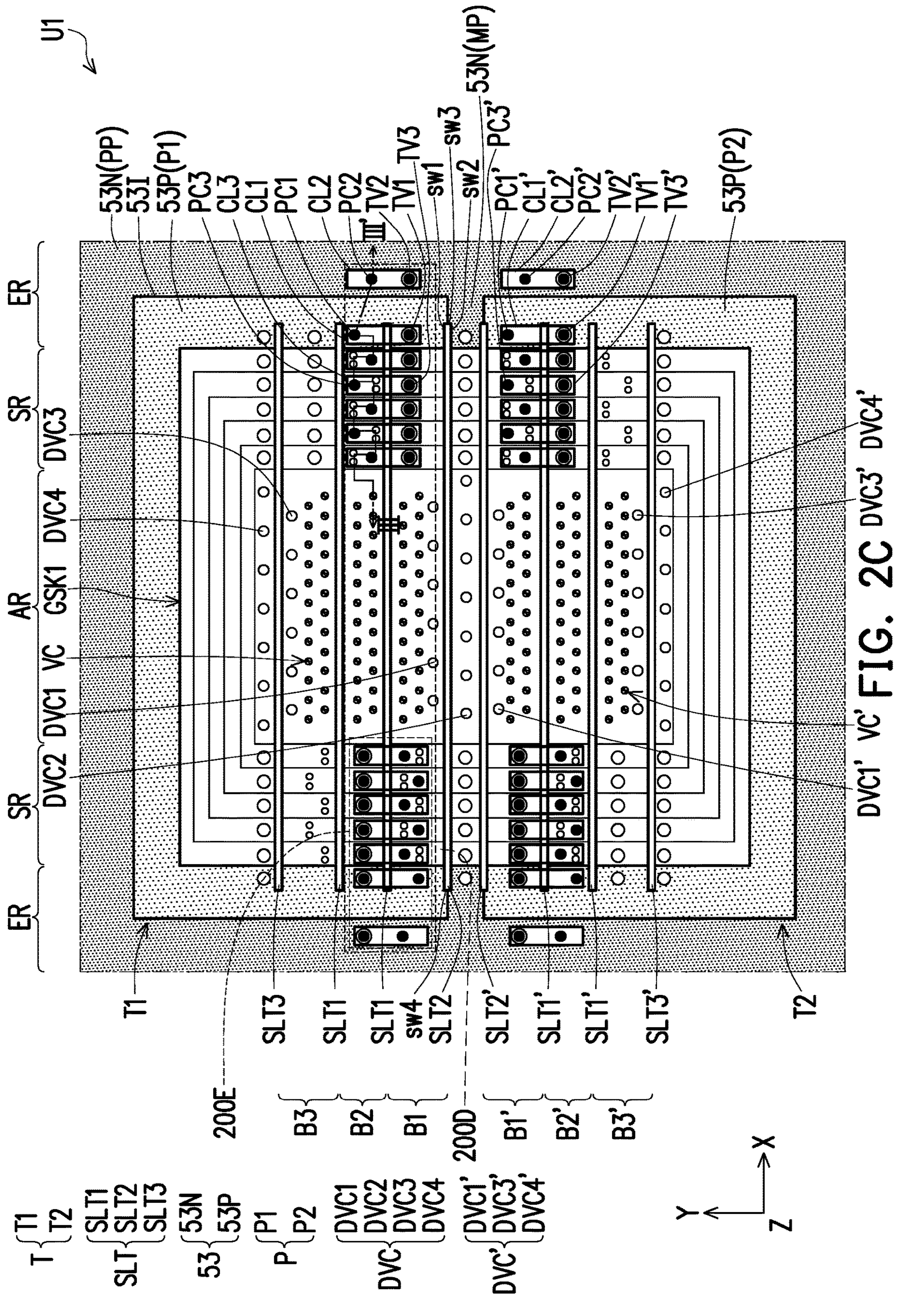
FIG. 2C is an enlarged view of a first unit U1 of FIG. 2B.
Figure 2D:
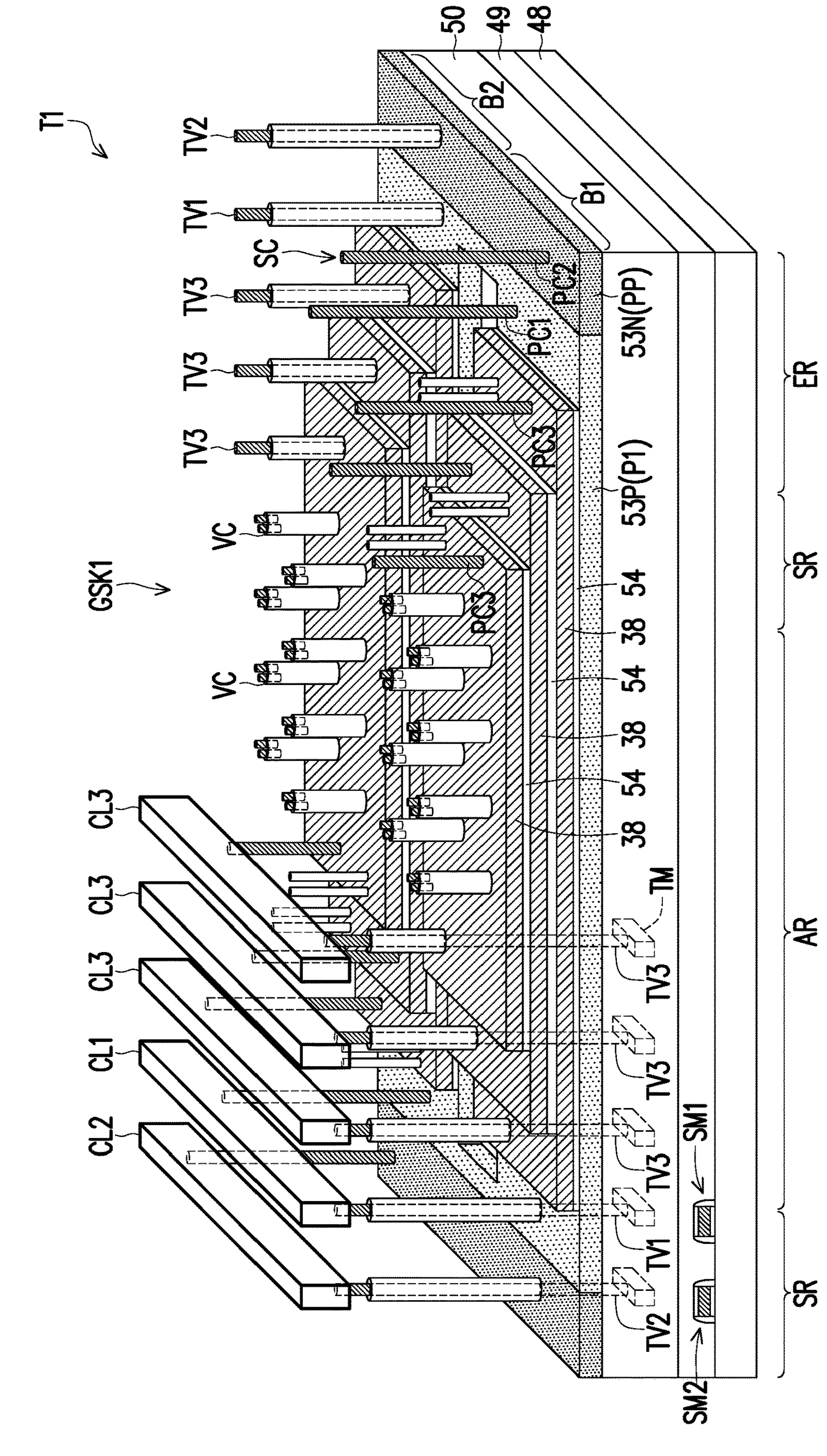
FIG. 2D is a perspective view of a partial area of FIG. 2C.
Figure 2E:
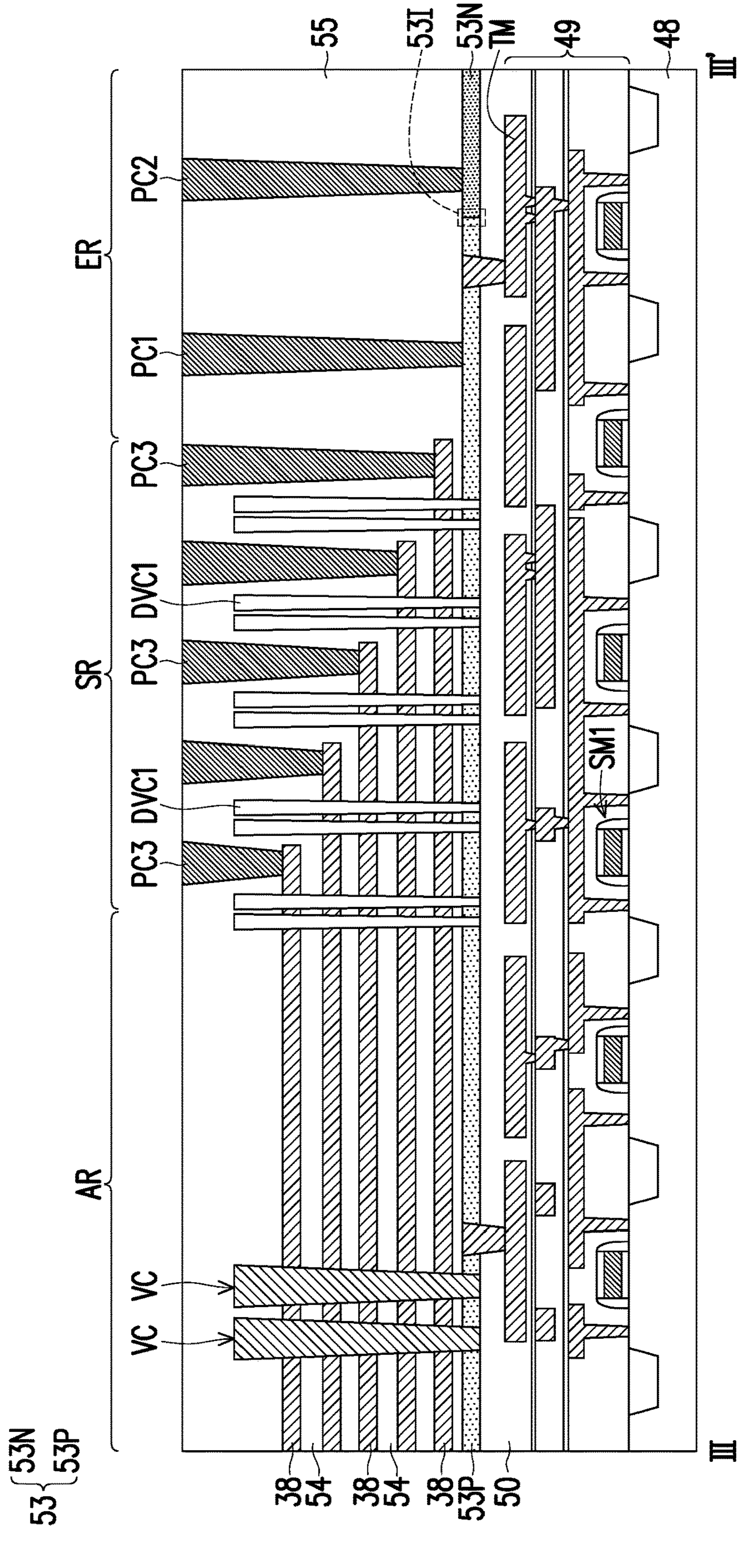
FIG. 2E is a cross-sectional view taken along the line III-III' of FIG. 2C.
Figure 2F:
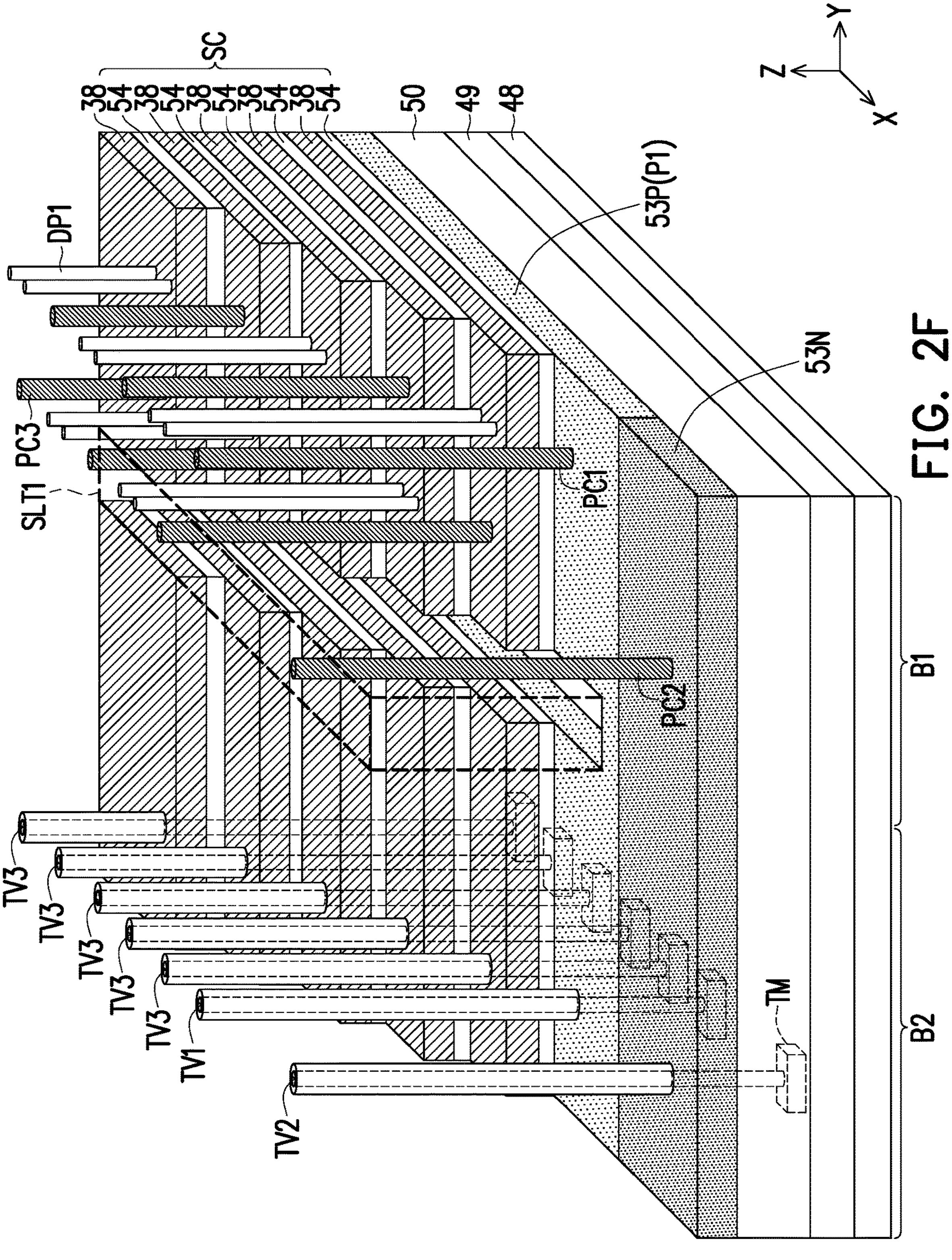
FIG. 2F is a perspective view of a partial area of FIG. 2C.

FIG. 2A is a top view of a memory die, according to an embodiment of the present disclosure. FIG. 2B is a top view of a partial area of FIG. 2A. FIG. 2C is an enlarged view of a first unit U1 of FIG. 2B. FIG. 2D is a perspective view of a partial area 200D of FIG. 2C. FIG. 2E is a cross-sectional view taken along the line III-III' of FIG. 2C. FIG. 2F is a perspective view of a partial area 200E of FIG. 2C.

Referring to FIG. 2A and FIG. 2B, a memory chip MC-1 may be an AND memory device. The memory chip MC-1 may include a region C1 and a region C2. The region C1 may include multiple tiles T separated from each other. The tiles T may be arranged in an array with multiple rows and multiple columns. In FIG. 2A, the tile array is formed by seven rows and eight columns, but the embodiment of the present disclosure is not limited thereto. Each tile T in the region C1 has multiple memory arrays. The region C2 includes peripheral circuits, such as complementary metal oxide semiconductor devices (CMOS), located on the periphery of the tile array. FIG. 2B shows a first unit U1 and a second unit U2. The first unit U1 includes a stacked structure GSK1 and the conductive layer 53. The second unit U2 includes a stacked structure GSK2 and the conductive layer 53. The stacked structure GSK1 and the conductive layer 53 of the first unit U1 may include tiles T1 and T2. The stacked structure GSK2 and the conductive layer 53 of the second unit U2 may include tiles T3 and T4.

The first unit U1 and the second unit U2 each include an array region AR, a staircase region SR, and an edge region ER.

Referring to FIG. 2B to FIG. 2C, the stacked structure GSK1 of the first unit U1 and the stacked structure GSK2 of the second unit U2 respectively extend along the X direction from the array region AR to the staircase region SR. The stacked structure GSK1 of the first unit U1 and the stacked structure GSK2 of the second unit U2 are separated from each other.

Projection areas of the conductive layer 53 of the first unit U1 and the conductive layer 53 of the second unit U2 are respectively larger than projection areas of the stacked structures GSK1 and GSK2. The conductive layer 53 of the first unit U1 and the conductive layer 53 of the second unit U2 respectively extend continuously, from the array region AR through the staircase region SR to the edge region ER. In other words, the conductive layer 53 extends continuously from the edge region ER (leftmost side) of the first unit U1 to the edge region ER (rightmost side) of the second unit U2. Moreover, the conductive layer 53 of the first unit U1 and the conductive layer 53 of the second unit U2 are connected with each other.

Referring to FIG. 2B to FIG. 2C, the stacked structure GSK1 of the first unit U1 and the stacked structure GSK2 of the second unit U2 are separated from each other and respectively extend in the X direction from the array region AR to the staircase region SR. The conductive layer 53 of the first unit U1 and the conductive layer 53 of the second unit U2 are connected with each other and respectively extend in the X direction continuously from the array region AR through the staircase region SR to the edge region ER. In other words, the conductive layer 53 extends continuously from the edge region ER (leftmost side) of the first unit U1 to the edge region ER (rightmost side) of the second unit U2. From a top view, the stacked structure GSK1 of the first unit U1 is surrounded by the conductive layer 53. The stacked structure GSK2 of the second unit U2 is surrounded by the conductive layer 53.

Referring to FIG. 2D, the conductive layer 53 is located on the substrate 48. Particularly, the conductive layer 53 is located between the stacked structure GSK1 and a dielectric layer 50, and extends laterally beyond the staircase region SR of the stacked structure GSK1. The conductive layer 53 in an embodiment of the present disclosure includes a doped semiconductor layer, such as a doped polysilicon layer. The conductive layer 53 in an embodiment of the present disclosure includes a first conductive type doping layer 53P and a second conductive type doping layer 53N. The first conductive type doping layer 53P may be grounded and adjacent to and in contact with the second conductive type doping layer 53N, and may form a hetero-junction 53I. The first conductive type doping layer 53P extends from the array region AR to the staircase region SR and to a portion of the edge region ER, and is located between the stacked structure GSK1 and the dielectric layer 50. In other words, the first conductive type doping layer 53P is located below the stacked structure GSK1 and extends laterally beyond the staircase structure SC of the stacked structure GSK1. The second conductive type doping layer 53N is located in another portion of the edge region ER, is located on the dielectric layer 50, and laterally surrounds the first conductive type doping layer 53P, as shown in FIG. 2C.

Referring to FIG. 2B, in an embodiment of the present disclosure, the first conductive type doping layer 53P includes multiple portions P separated from each other. The second conductive type doping layer 53N surrounds multiple portions P. In FIG. 2B, the first conductive type doping layer 53P includes a first portion P1, a second portion P2, a third portion P3 and a fourth portion P4. The second conductive type doping layer 53N surrounds the first portion P1, the second portion P2, the third portion P3 and the fourth portion P4. The first unit U1 includes the first portion P1 and the second portion P2 of the first conductive type doping layer 53P. The second unit U2 includes the third portion P3 and the fourth portion P4 of the first conductive type doping layer 53P. The second conductive type doping layer 53N of the first unit U1 surrounds the first portion P1 and the second portion P2. The second conductive type doping layer 53N of the second unit U2 surrounds the third portion P3 and the fourth portion P4.

The second conductive type doping layer 53N of the first unit U1 and the second unit U2 each includes a middle portion MP and a peripheral portion PP. In the first unit U1, the middle portion MP is located between the first portion P1 and the second portion P2 of the first conductive type doping layer 53P. In other words, the middle portion MP of the second conductive type doping layer 53N separates the first conductive type doping layer 53P into two portions, i.e., the first portion P1 and the second portion P2. The middle portion MP of the second unit U2 is located between the third portion P3 and the fourth portion P4 of the first conductive type doping layer 53P. In other words, the middle portion MP of the second conductive type doping layer 53N separates the first conductive type doping layer 53P into two portions, i.e., the third portion P3 and the fourth portion P4. The peripheral portion PP of the first unit U1 surrounds the first portion P1 and the second portion P2 of the first conductive type doping layer 53P. The peripheral portion PP of the second unit U2 surrounds, and is connected with, the third portion P3 and the fourth portion P4 of the first conductive type doping layer 53P.

The first unit U1 and the second unit U2 each include multiple separation structures SLT and SLT', which are elongated trenches. The separation structures SLT divide a portion of the stacked structure GSK1, and defines the tile T1 and multiple blocks B1, B2 and B3 in the tile T1 and tile T3. Similarly, the separation structures SLT' define multiple blocks B1', B2' and B3' in the tile T2 and tile T4. To be concise, the first unit U1 in FIG. 2C will be further described as an example.

In FIG. 2C, the separation structure SLT includes multiple first separation walls SLT1, a second separation wall SLT2 and a third separation wall SLT3. The multiple first separation walls SLT1 are located between the second separation wall SLT2 and the third separation wall SLT3. Thus, the multiple first separation walls SLT1 are also referred to as multiple first inner separation walls SLT1. The second separation wall SLT2 is close to the center of the first unit U1 and is thus also referred to as a first middle separation wall SLT2. The third separation wall is located outside the multiple first inner separation walls SLT1 and is thus also referred to as a first outer separation wall SLT3. In some aspects, the first outer separation wall SLT3 and the first middle separation wall SLT2 define the first tile T1 of the stacked structure GSK1. The second outer separation wall SLT3' and the second middle separation wall SLT2' define the second tile T2 of the stacked structure GSK1.

In some embodiments, multiple first separation walls SLT1, the second separation wall SLT2 and the third separation wall SLT3 are separated from each other and are not connected, and they are substantially parallel, for example, they extend in the X direction and are arranged in the Y direction. In some embodiments, the X direction is also called a first direction, the Y direction is also called a second direction, and the Z direction is also called a third direction.

Multiple first separation walls SLT1, the second separation wall SLT2, and the third separation wall SLT3 define multiple blocks B within the first tile T1. In FIG. 2C, the first tile T1 includes three blocks B1, B2, and B3. However, the embodiment of the present disclosure is not limited thereto.

The second separation wall SLT2 is located between the first portion P1 of the first conductive type doping layer 53P and the second conductive type doping layer 53N. A sidewall sw1 of the second separation wall SLT2 is adjacent to and in contact with the first portion P1 of the first conductive type doping layer 53P. A sidewall sw2 of the second separation wall SLT2 is adjacent to and in contact with the middle portion MP of the second conductive type doping layer 53N. Also, sidewalls sw3 and sw4 at two ends of the second separation wall SLT2 may be adjacent to or connected to the hetero-junction 53I.

Similarly, the separation structure SLT' includes multiple first separation walls SLT1', a second separation wall SLT2' and a third separation wall SLT3', they are respectively similar to multiple first separation walls SLT1, the second separation wall SLT2, and the third separation walls SLT3 and the description thereof is not repeated herein. The second separation wall SLT2 of the first tile T1 and the second separation wall SLT2' of the second tile T2 are separated by the middle portion MP of the second conductive type doping layer 53N therebetween.

In addition, the stacked structure GSK1 further includes multiple channel pillar structures VC, multiple first dummy pillars DVC1 and multiple second dummy pillars DVC2 extending in the Z direction. Multiple channel pillar structures VC are disposed in the blocks B1, B2 and B3 of the stacked structure GSK1, and multiple first separation walls SLT1 separate multiple channel pillar structures VC from each other. Similarly, multiple channel pillar structures VC' are disposed in the blocks B1', B2' and B3' of the stacked structure GSK1, and multiple first separation walls SLT1' separate multiple channel pillar structures VC' from each other.

Multiple first dummy pillars DVC1 and multiple second dummy pillars DVC2 are located at both sides of the second separation wall SLT2, and the second separation wall SLT2 separates multiple first dummy pillars DVC1 and multiple second dummy pillars DVC2 from each other. Multiple first dummy pillars DVC1 extend in the Z direction through the stacked structure GSK1 above the first portion P1 of the first conductive type doping layer 53P. Multiple second dummy pillars DVC2 extend in the Z direction through the stacked structure GSK1 above the middle portion MP of the second conductive type doping layer 53N. Multiple first dummy pillars DVC1 and multiple second dummy pillars DVC2 are separated by the second separation wall SLT2. Similarly, multiple first dummy pillars DVC1' and multiple second dummy pillars DVC2' are located at both sides of the second separation wall SLT2'. The second separation wall SLT2' separates multiple first dummy pillars DVC1' and multiple second dummy pillars DVC2' from each other. Multiple first dummy pillars DVC1' extend in the Z direction through the stacked structure GSK1 above the second portion P2 of the first conductive type doping layer 53P.

Multiple third dummy pillars DVC3 and multiple fourth dummy pillars DVC4 are located at both sides of the third separation wall SLT3, and the third separation wall SLT3 separates multiple third dummy pillars DVC3 and multiple fourth dummy pillars DVC4 from each other. Multiple third dummy pillars DVC3 and multiple fourth dummy pillars DVC4 extend in the Z direction through the stacked structure GSK1 above the first portion P1 of the first conductive type doping layer 53P. Similarly, multiple third dummy pillars DVC3' and multiple fourth dummy pillars DVC4' are located at both sides of the third separation wall SLT3', and the third separation wall SLT3' separates multiple third dummy pillars DVC3' and multiple fourth dummy pillars DVC4' from each other. Multiple third dummy pillars DVC3' and multiple fourth dummy pillars DVC4' extend in the Z direction through the stacked structure GSK1 above the second portion P2 of the first conductive type doping layer 53P.

Referring to FIG. 2C, in an embodiment of the present disclosure, two ends of the separation structures SLT, SLT' extending in the X direction do not extend to the hetero-junction 53I between the first conductive type doping layer 53P and the second conductive type doping layer 53N and do not extend to the second conductive type doping layer 53N. Thus, the first portion P1 and the second portion P2 of the first conductive type doping layer 53P are not cut into multiple segments by the separation structures SLT, SLT' respectively, and thus the first portion P1 and the second portion P2 of the first conductive type doping layer 53P remain a continuous layer respectively. Similarly, two ends of the separation structures SLT, SLT' do not extend to the peripheral portion PP of the second conductive type doping layer 53N, the middle portion MP and the peripheral portion PP of the second conductive type doping layer 53N remain connected, and thus the second conductive type doping layer 53N remains a continuous layer.

Referring to FIG. 2C and FIG. 2D, in an embodiment of the present disclosure, the first portion P1 and the second portion P2 of the first conductive type doping layer 53P are electrically connected to the first conductive plugs PC1 and PC1' located outside the staircase structure SC, respectively. The first conductive plugs PC1 and PC1' are electrically connected to the first conductive lines CL1 and CL1' located thereabove, respectively. The first conductive lines CL1 and CL1' are electrically connected to the first through vias TV1 and TV1', respectively. The first through vias TV1 and TV1' are disposed outside the lowest stair of the staircase structure SC, and thus do not overlap with the staircase structure SC. The first through vias TV1 and TV1' pass through the first portion P1 and the second portion P2 of the first conductive type doping layer 53P in the Z direction, respectively, and are connected to a top metal layer TM and are further electrically connected to the first device SM1 located above the substrate 48 respectively. That is, the first portion P1 of the first conductive type doping layer 53P is electrically connected to the first device SM1 through the first conductive plug PC1, the first conductive line CL1 and the first through via TV1. The second portion P2 of the first conductive type doping layer 53P is electrically connected to another first device (not shown) above the substrate 48 through the first conductive plug PC1', the first conductive line CL1' and the first through via TV1'.

The peripheral portion PP of the second conductive type doping layer 53N is electrically connected to the second conductive plugs PC2 and PC2' located outside the first portion P1 and the second portion P2 of the first conductive type doping layer 53P. The second conductive plugs PC2 and PC2' are electrically connected to the second conductive lines CL2 and CL2' located thereabove, respectively. The second conductive lines CL2 and CL2' are electrically connected to the second through vias TV2 and TV2' provided at the peripheral portion PP of the second conductive type doping layer 53N. The second through vias TV2 and TV2' pass through the second conductive doping layer 53N, and are connected to a top metal layer TM and are further electrically connected to the second device SM2 located above the substrate 48 respectively. That is, the second conductive type doping layer 53N is electrically connected to the second device SM2 above the substrate 48 through the second conductive plugs PC2, PC2', the second conductive lines CL2, CL2' and the second through vias TV2, TV2'. In FIG. 2C, the peripheral portion PP of the second conductive type doping layer 53N is electrically connected to the second conductive plugs PC2 and PC2' located outside the first conductive type doping layer 53P. In FIG. 2C, two second conductive plugs PC2 and two second conductive plugs PC2', two second conductive lines CL2 and two second conductive line CL2' connected thereto, and two second through vias TV2 and two second through vias TV2 are illustrated. However, the present disclosure is not limited thereto. In another embodiment, there may be more second conductive plugs PC2', second conductive lines CL2' and second through vias TV2'.

In some embodiments, the first conductive type doping layer 53P is in contact with the second conductive type doping layer 53N to form a hetero-junction 53I. A voltage V1 may be applied to the first conductive type doping layer 53P through the first device SM1, the first conductive plug PC1, the first conductive line CL1 and the first through via TV1, and a voltage V2 may be applied to the second conductive type doping layer 53N through the second device SM2, the second conductive plug PC2, the first conductive line CL1 and the second through via TV2. By controlling the voltage difference ΔV between the voltages V1 and V2 smaller than a threshold voltage $V_{th}$ (i.e., $\Delta V<Vth$) of the hetero-junction 53I, the hetero-junction 53I is not conductive and a leakage path is thus close, so that a leakage current of the memory device may be reduced.

Each of multiple third conductive plugs PC3 and PC3' is located on the staircase region SR of one of the blocks (such as block B2, B2') of the stacked structure GSK1, and is respectively connected to one of multiple conductive layers 38. The third through via TV3, TV3' is respectively located on the staircase region SR of another adjacent block (such as block B1, B1') of the stacked structure GSK1, passes through the stacked structure GSK1 and is connected to the third device above the substrate 48. The third conductive lines CL3 and CL3' are respectively connected to the third conductive plugs PC3 and PC3' and the third through vias TV3 and TV3'. One of multiple conductive layers 38 is connected to the third device through the third conductive plug PC3 or PC3', the third conductive line CL3 or CL3' and the third through via TV3 or TV3'.

FIG. 3A to FIG. 3E are schematic cross-sectional views of a method of fabricating a memory device according to some embodiments of the present disclosure. FIG. 4A to FIG. 4E are perspective views of partial areas 400 in FIG. 3A to FIG. 3E.

Figure 3A:
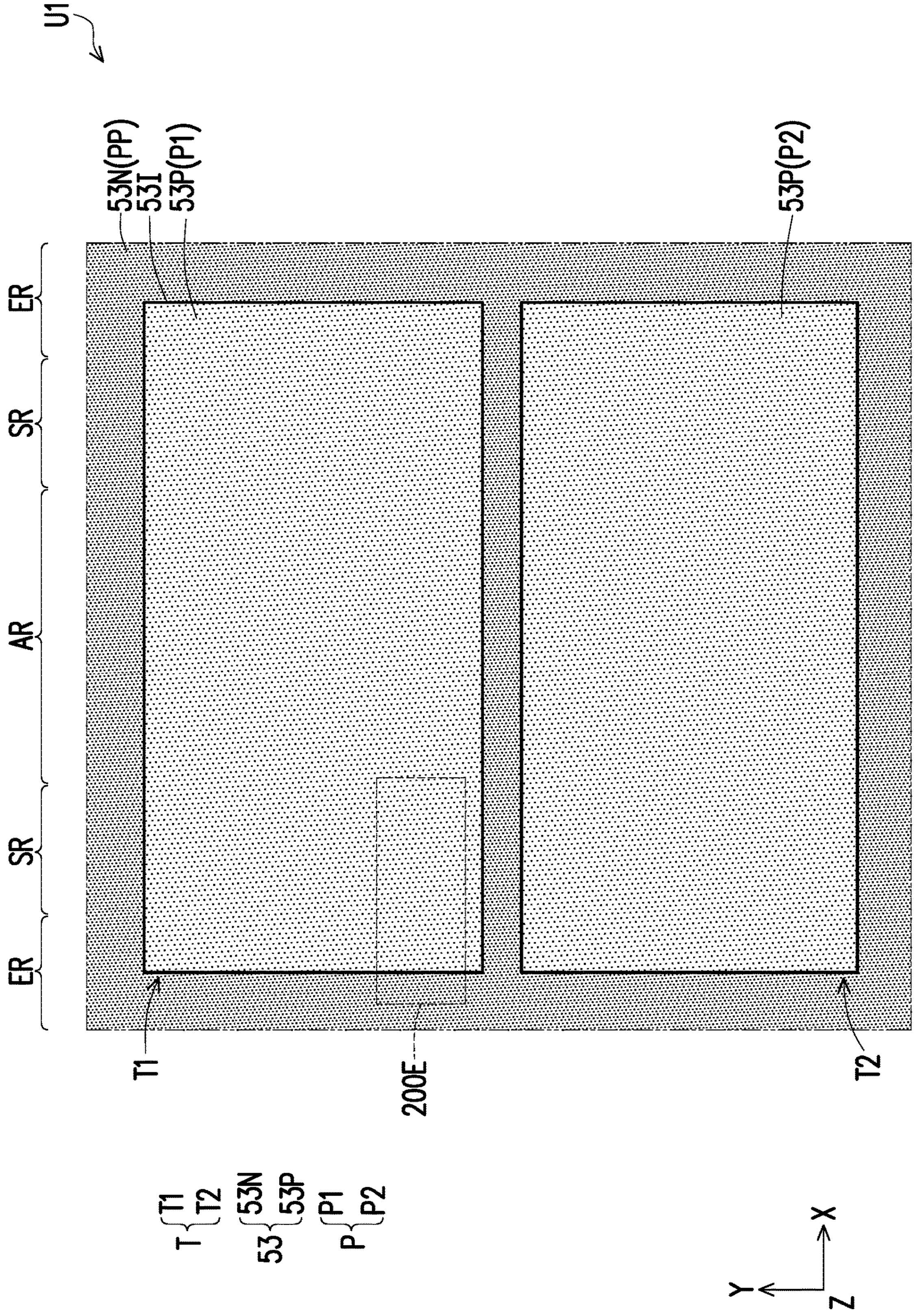
FIG. 3A to FIG. 3E are schematic cross-sectional views of a method of fabricating a memory device according to an embodiment of the present disclosure.
Figure 4A:
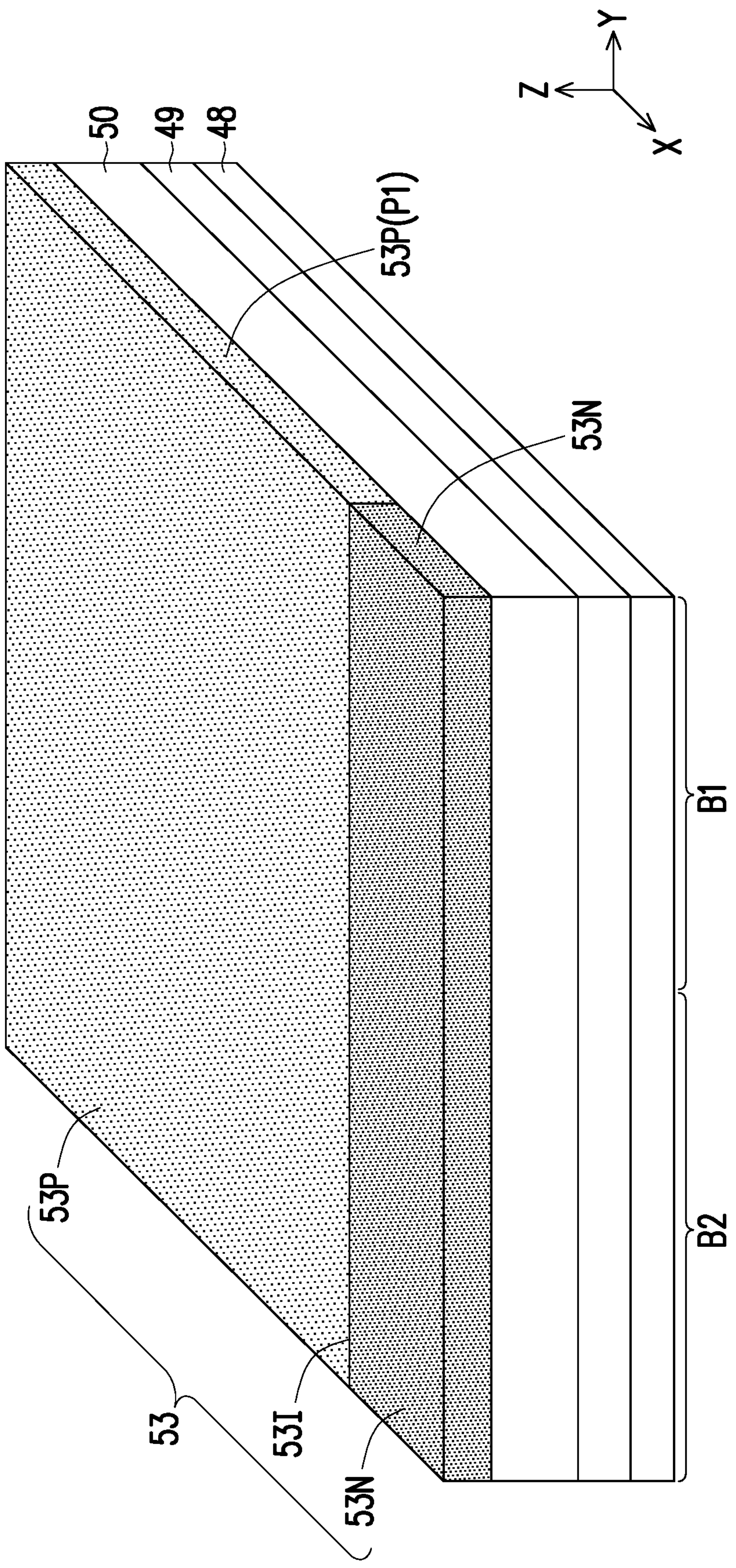
FIG. 4A to FIG. 4E are perspective views of partial areas in FIG. 3A to FIG. 3E.

Referring to FIG. 3A and FIG. 4A, a substrate 48 is provided. The substrate 48 includes an array region AR, a staircase region SR and an edge region ER. The substrate 48 includes a semiconductor substrate, such as a silicon substrate. The substrate 48 may include components such as active elements (such as PMOS, NMOS, CMOS, JFET, BJT, or diodes) or passive elements. An interconnection structure 49 is formed on the array region AR, the staircase region SR, and the edge region ER of the substrate 48. The interconnection structure 49 may include components such as an intra-layer dielectric layer, a contact, a wire, an interlayer dielectric layer, and a via. The material of each of the intra-layer dielectric layer and the interlayer dielectric layer may include a silicon oxide layer. Next, a dielectric layer 50 is formed on the interconnection structure 49. The material of the dielectric layer 50 may include silicon oxide. In some embodiments, the dielectric layer 50 may also be referred to as a dielectric substrate 50.

Continue referring to FIG. 3A and FIG. 4A, a blanket-type conductive layer 53 is formed on the dielectric layer 50 in the array region AR and the staircase region SR. The conductive layer 53 also extends to the edge region ER. The conductive layer 53 may include a first conductive type doping layer 53P and a second conductive type doping layer 53N.

The first conductive type doping layer 53P is, for example, a P-type doping layer 53P, and the second conductive type doping layer 53N is, for example, an N-type doping layer 53N. The P-type doping layer 53P is, for example, a P-type polysilicon layer. The N-type doping layer 53N is, for example, an N-type polysilicon layer. The P-type doping layer 53P may include a first portion P1 and a second portion P2. The conductive layer 53 may be formed by forming a conductive material by a chemical vapor deposition method, forming a patterned implant mask on the substrate 48, and performing an ion implantation process to form the P-type doping layer 53P and the N-type doping layer 53N.

Figure 3B:
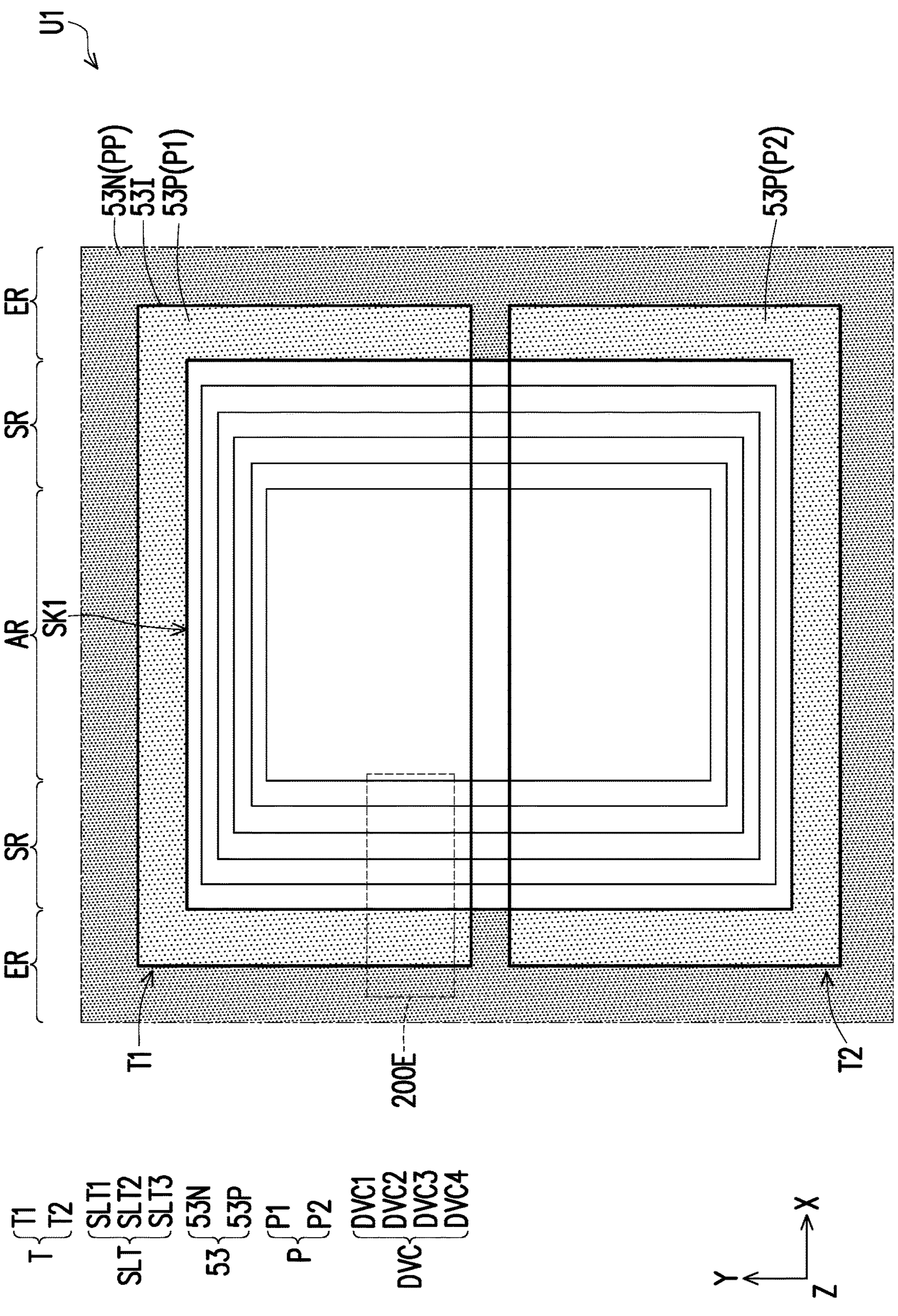
Figure 4B:
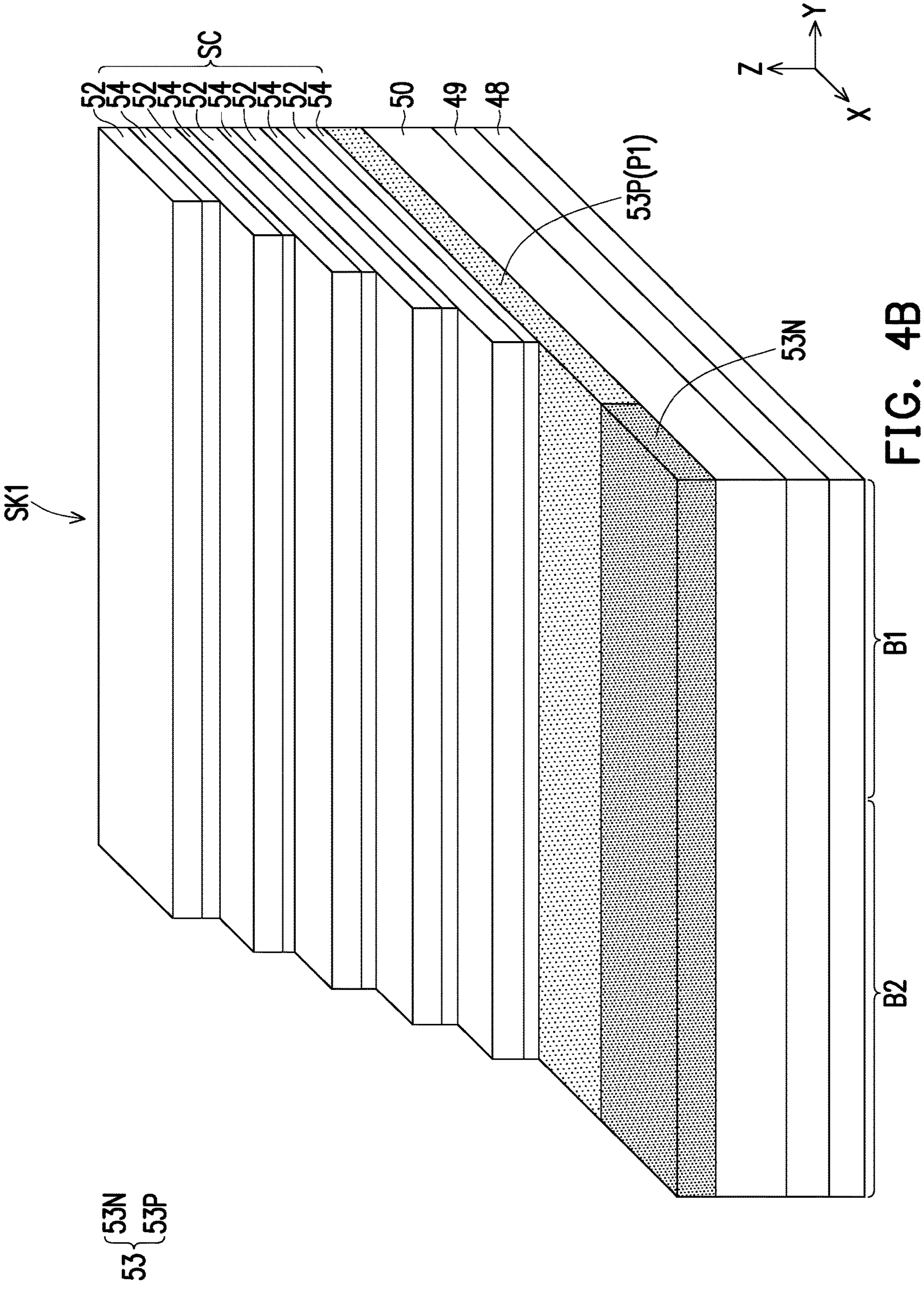

Referring to FIG. 3B and FIG. 4B, a stacked structure SK1 is formed on the conductive layer 53, and the stacked structure SK1 is patterned to form a staircase structure SC in the staircase region SR. In this embodiment, the stacked structure SK1 includes insulating layers 54 and the intermediate layer 52 that are sequentially alternately stacked on the conductive layer 53. In other embodiments, the stacked structure SK1 may be composed by intermediate layers 52 and insulating layers 54 that are sequentially alternately stacked on the conductive layer 53. The material of the insulating layers 54 may include silicon oxide. The material of the intermediate layers 52 may include silicon nitride. The intermediate layers 52 may be used as sacrificial layers, which are partially removed in the subsequent processes. In this embodiment, the stacked structure SK1 has four insulating layers 54 and five intermediate layers 52, but the disclosure is not limited thereto. In other embodiments, more insulating layers 54 and more intermediate layers 52 may be formed according to actual needs. After that, photolithography and etching processes and a trimming process are performed to form a staircase structure SC.

A dielectric layer 55 (as shown in FIG. 2E) is formed on the substrate 48 to cover the staircase structure SC. The material of the dielectric layer 55 may include silicon oxide. The method of forming the dielectric layer 55 may include forming a dielectric material to cover the staircase structure SC. Afterwards, a planarization process is performed by chemical mechanical polishing process, for example. For clarity, the dielectric layer 55 is not shown in FIG. 3B and FIG. 3B.

Figure 3C:
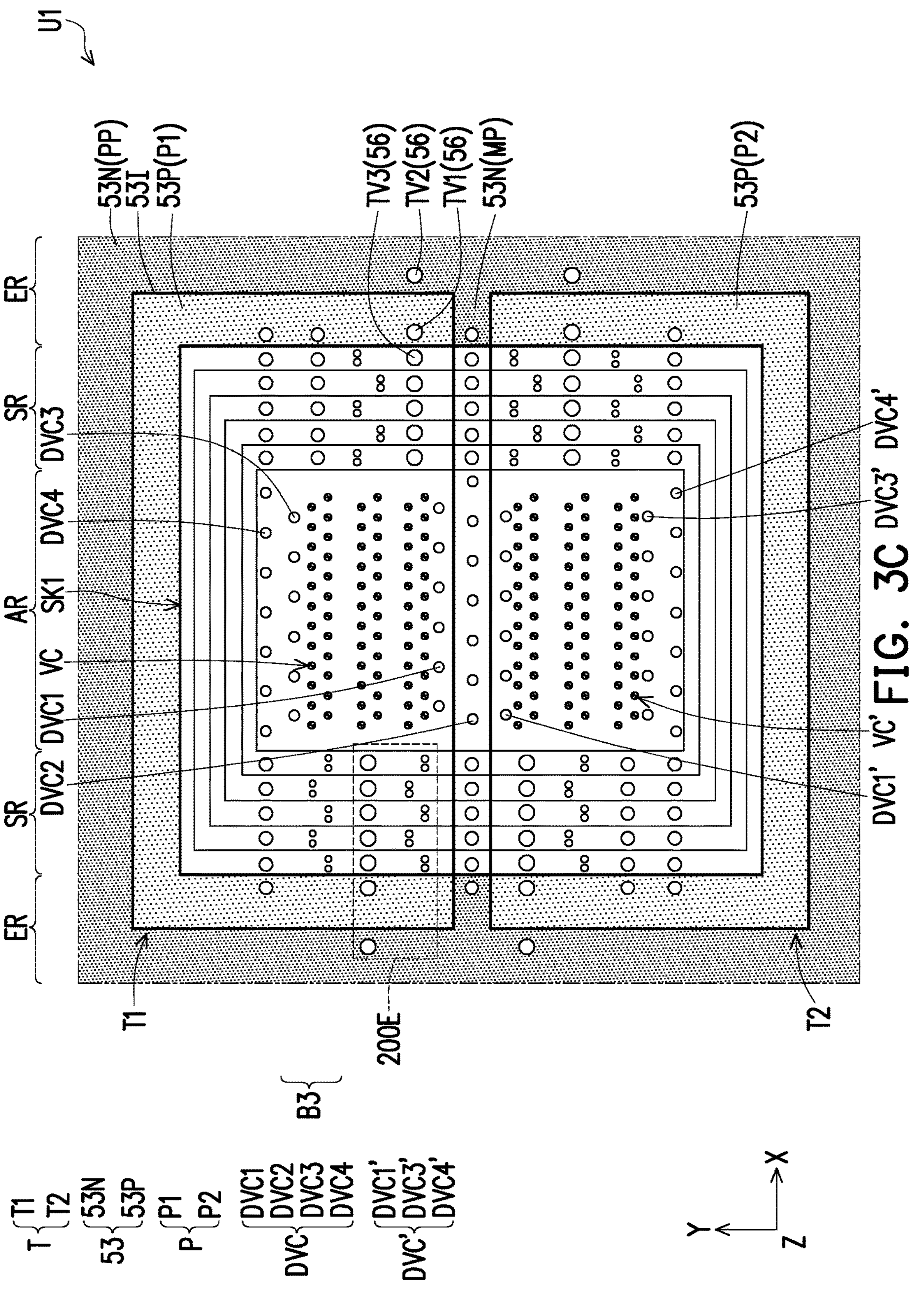

Referring to FIG. 3C, multiple channel pillar structures VC, VC' are formed in the stacked structure SK1. The formation of multiple channel pillar structures VC' is similar to that of multiple channel pillar structures VC, and thus for clarity, only formation of multiple channel pillar structures VC is described. First, multiple openings are formed in the stacked structure SK1. The openings expose the first conductive type (e.g., P type) doping layer 53P of the conductive layer 53. The etching process may include a dry etching process, a wet etching process or a combination thereof. The dry etching process may include a plasma etching process. In this embodiment, from the top view, the opening has a circular shape, but the disclosure is not limited thereto. In other embodiments, the opening may have other shapes, such as a polygon shape (not shown). Next, in some embodiments, the tunneling layer 14 and the channel pillar 16 are formed in the opening, as shown in FIG. 1D and FIG. 1E. The tunneling layer 14 may be formed in the subsequent processes. For simplicity, the channel pillar 16 and the tunneling layer 14 are not shown in FIG. 3C.

Referring to FIG. 1D and FIG. 1E, the tunneling layer 14 and the channel pillar 16 may penetrate through the stacked structure SK1 but do not penetrate through the conductive layer 53, but the present disclosure is not limited thereto. The channel pillar 16 may be annular from a top view, and may be continuous in its extending direction (e.g., in a direction perpendicular to the surface of the substrate 48). That is to say, the channel pillar 16 is integral in its extending direction, and is not divided into multiple disconnected parts. In some embodiments, the channel pillar 16 may have a circular shape from a top view, but the present disclosure is not limited thereto. In other embodiments, the channel pillar 16 may also have other shapes (such as polygonal shape) from a top view.

Referring to FIG. 1D and FIG. 1E, an insulating filling material is formed on the stacked structure SK1 and filled in the openings. The insulating filling material may include low-temperature silicon oxide. The insulating filling material filled in the opening forms an insulating filling layer 24, and a circular void is left at the center of the insulating filling layer 24. Then, an anisotropic etching process is performed to enlarge the circular void to form a hole 109. An insulating material is formed on the insulating fill layer 24 and filled in the hole 109. Then, an anisotropic etching process is performed to remove a part of the insulating material to form an insulating pillar 28 in the hole 109. The material of the insulating pillar 28 is different from the material of the insulating filling layer 24. The material of the insulating pillar 28 may include silicon nitride.

Referring to FIG. 1D and FIG. 1E, a patterning processes (e.g., lithography and etching processes) is performed to form holes (not shown) in the insulating filling layer 24. During the etching process, the conductive layer 53 may serve as an etching stop layer. Therefore, the formed holes extend from the stacked structure SK1 to the exposed conductive layer 53. The profiles of the hole patterns defined in the patterning process may be tangent to the profile of the insulating pillar 28. The profiles of the hole patterns defined in the patterning process may also exceed the profile of the insulating pillar 28 (not shown).

Referring to FIG. 1D and FIG. 1E, conductive pillars 32*a* and 32*b* are formed in the holes. The conductive pillars 32*a* and 32*b* may serve as source and drain pillars respectively, and are electrically connected to the channel pillar 16 respectively. The conductive pillars 32*a* and 32*b* may be formed by forming a conductive layer on the insulating filling layer 24 and in the holes, and followed by an etching back. The conductive pillars 32*a* and 32*b* may include doped polysilicon.

Figure 4C:
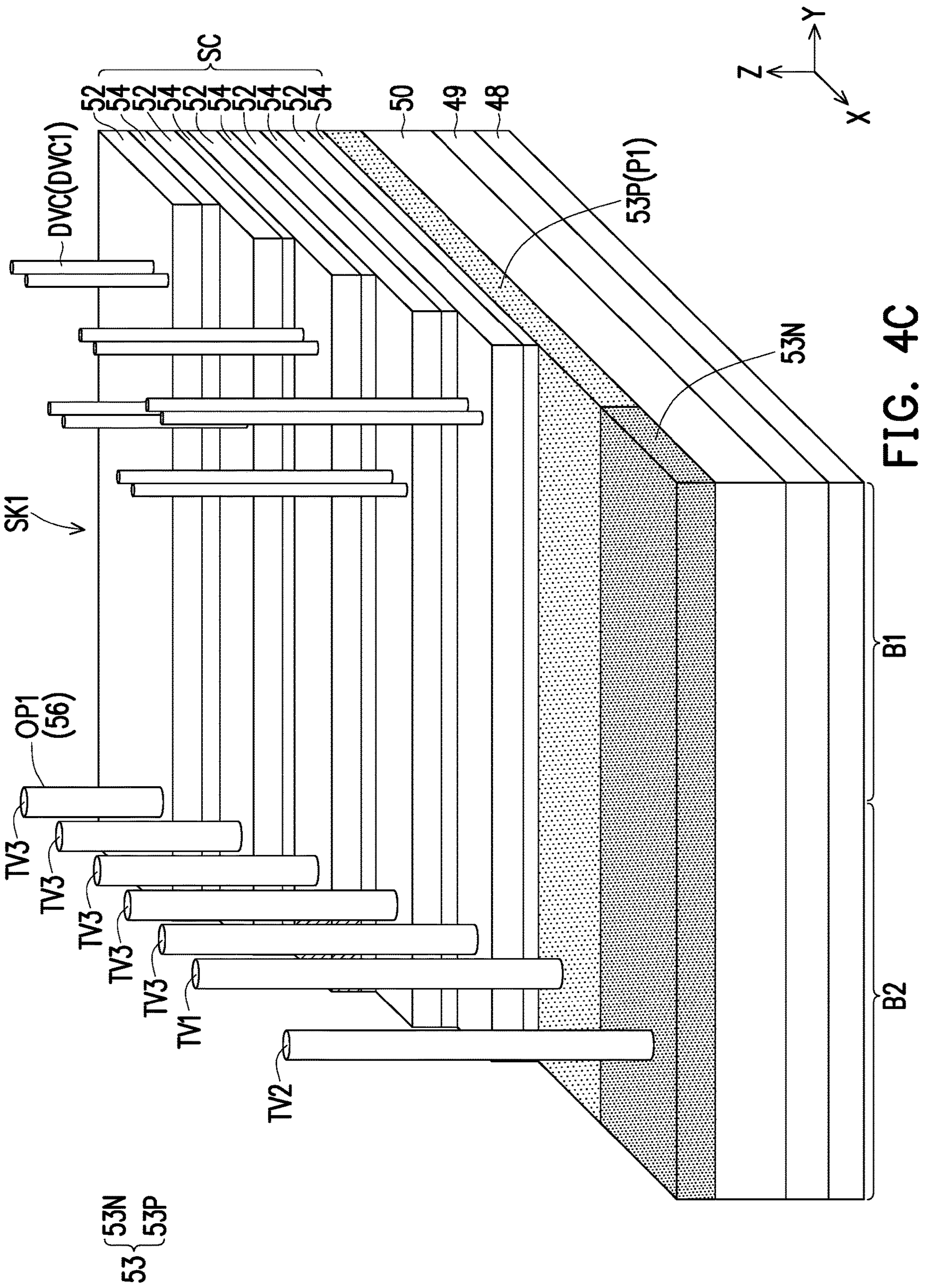

Referring to FIG. 3C and FIG. 4C, photolithography and etching processes are performed to form multiple first openings OP1. After that, an insulating material is filled into multiple first opening OP1 to form an insulating layer 56 of the through via TV1, TV2, TV3 and TV1', TV2', TV3'. The insulating material is, for example, silicon oxide. In addition, multiple dummy structures DVC and DVC' are formed in the stacked structure SK1. Multiple dummy structures DVC and DVC' may be insulating material. Multiple dummy structures DVC and DVC' may include the above-mentioned multiple first dummy structures DVC1 and DVC1', multiple second dummy structures DVC2 and DVC2', multiple third dummy structures DVC3 and DVC3', and multiple fourth dummy structures DVC4 and DVC4'.

Figure 3D:
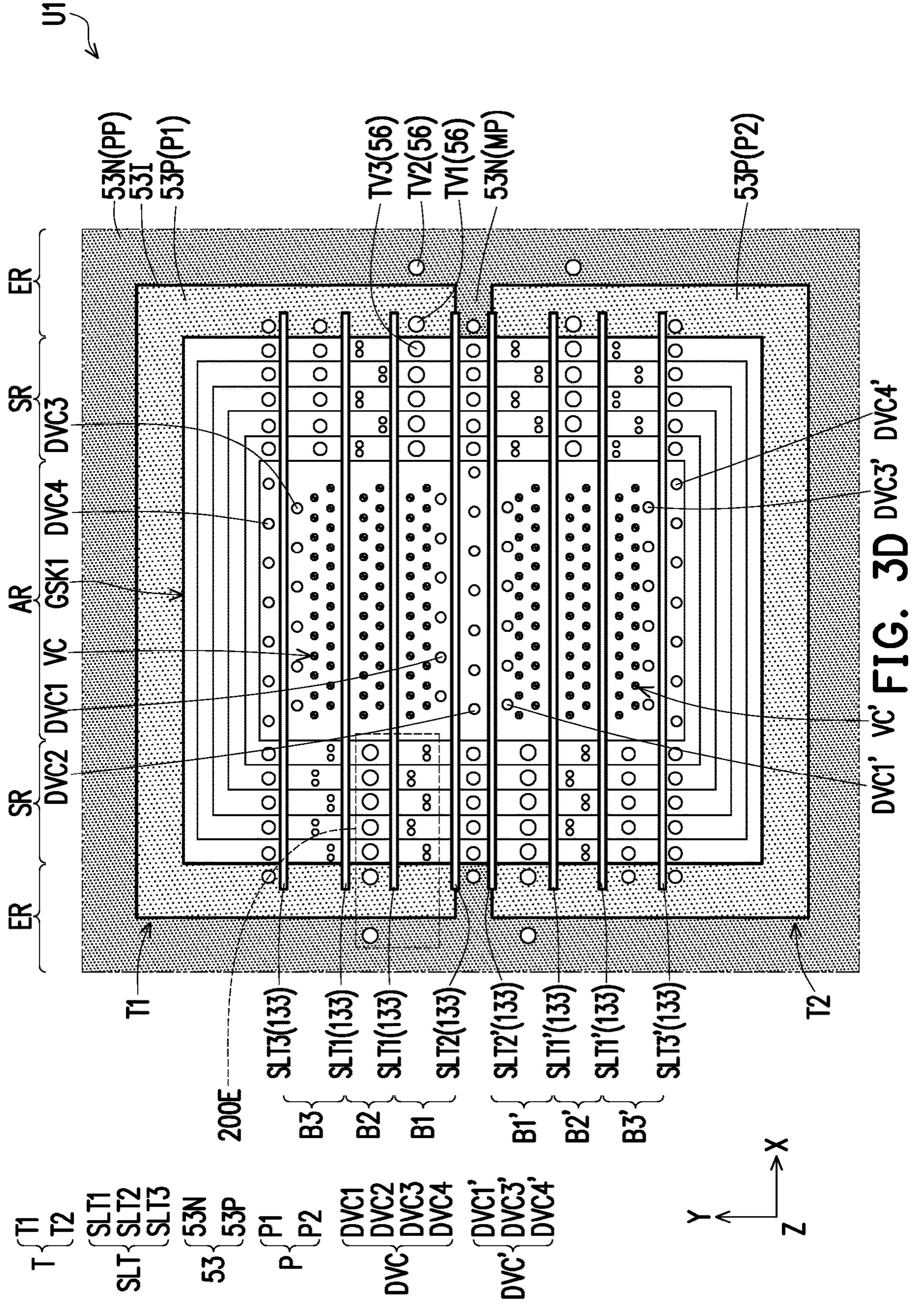
Figure 4D:
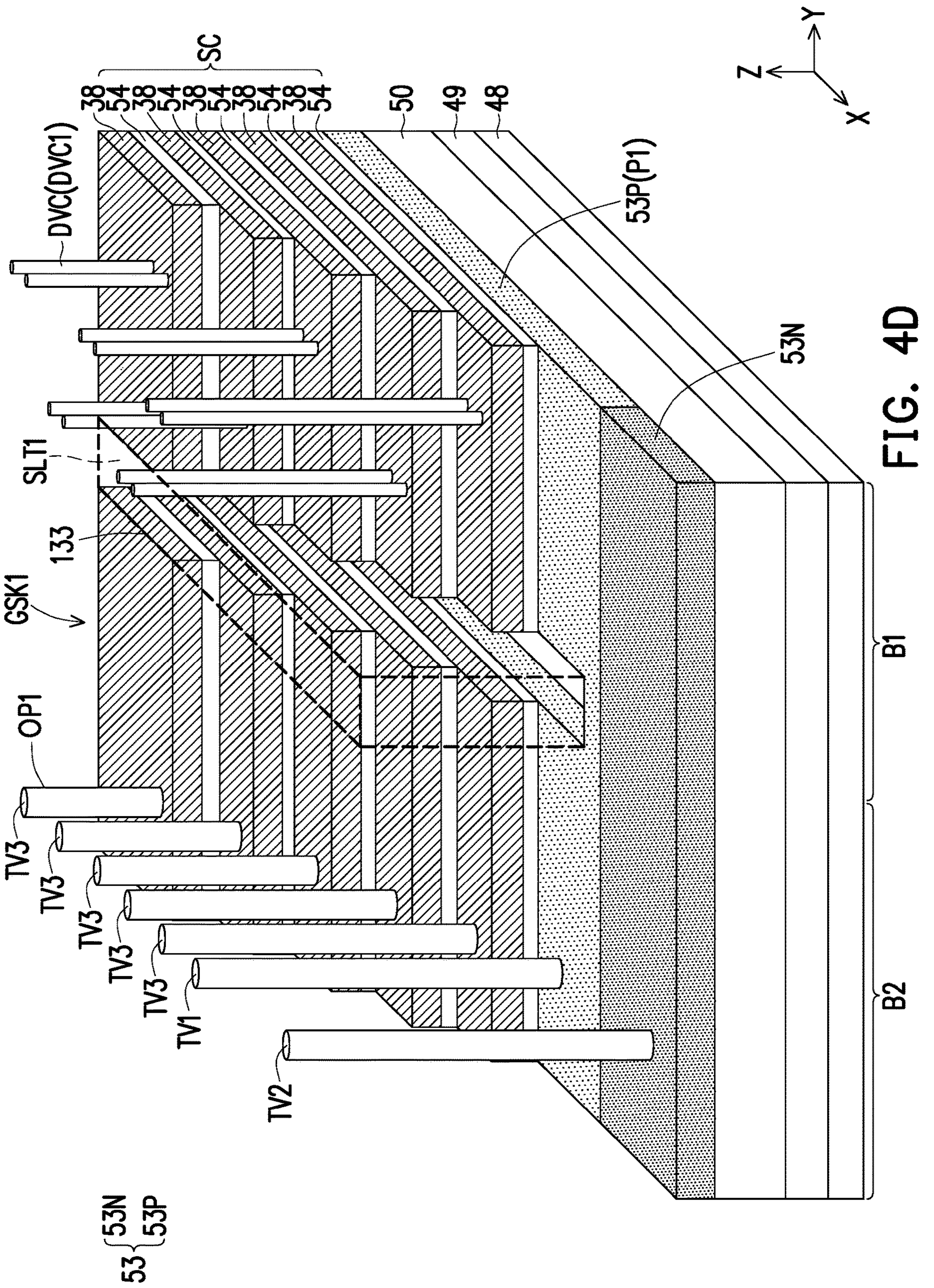

Referring to FIG. 3D and FIG. 4D, the stacked structure SK1 and the conductive layer 53 are patterned to form multiple separation trenches 133. During the etching process, the dielectric layer 50 or the conductive layer 53 may serve as an etching stop layer, so that the separation trenches 133 expose the dielectric layer 50 or the conductive layer 53. The etching process may include a dry etching process, such as a plasma etching process.

Referring to FIG. 3D and FIG. 4D, a replacement process is performed to the intermediate layers 52. First, an etching process such as a wet etching process is performed to remove a part of the intermediate layers 52 to form multiple horizontal openings (not shown). Multiple charge storage layers 12, multiple barrier layers 36 and multiple conductive layers 38 are respectively formed in multiple horizontal openings, as shown in FIG. 1D. The charge storage layers 12 may include silicon nitride. The blocking layers 36 may include a material having a high dielectric constant greater than or equal to 7, such as aluminum oxide ($Al_2O_3$), hafnium oxide ($HfO_2$), lanthanum oxide ($La_2O_5$), transition metal oxide, lanthanide oxide or a combination thereof. The conductive layers 38 may include tungsten. In some embodiments, multiple barrier layers (not shown) are also formed prior to the formation of the conductive layers 38. The material of the barrier layers may include titanium (Ti), titanium nitride (TiN), tantalum (Ta), tantalum nitride (TaN) or a combination thereof.

Referring to FIG. 1D, the method of forming the charge storage layer 12, the blocking layer 36, the barrier layer and the conductive layer 38 includes sequentially forming a storage material, a blocking material, a barrier material and a conductive material in the separation trenches 133 and the horizontal openings. Then, an etching back process is performed to remove the storage material, the blocking material, the barrier material and the conductive material in the separation trenches 133. The tunneling layer 14, the charge storage layer 12 and the blocking layer 36 are collectively referred to as a charge storage structure 40. The gate stacked structure GSK (GSK1) is thus formed. The gate stacked structure GSK (GSK1) is located on the substrate 48 and includes multiple conductive layers 38 and multiple insulating layers 54 alternately stacked.

Figure 5C:
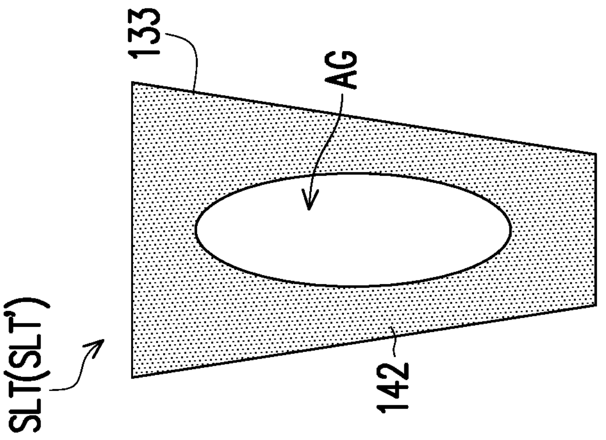
FIG. 5A to FIG. 5C are schematic cross-sectional views of various separation structures according to embodiments of the present disclosure.

Referring to FIG. 3D and FIG. 4D, the separation structures SLT, SLT' are formed in the separation trenches 133. The separation structures SLT, SLT' include multiple first separation walls SLT1, SLT1', multiple second separation walls SLT2, SLT2' and multiple third separation walls SLT3, SLT3'. Each of the separation structures SLT, SLT' may have a single-layer or multi-layer structure, as shown in FIG. 5A to FIG. 5C.

Figure 5B:
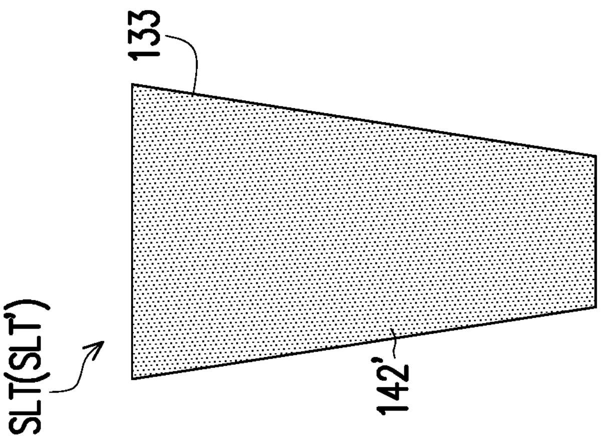
Figure 5A:
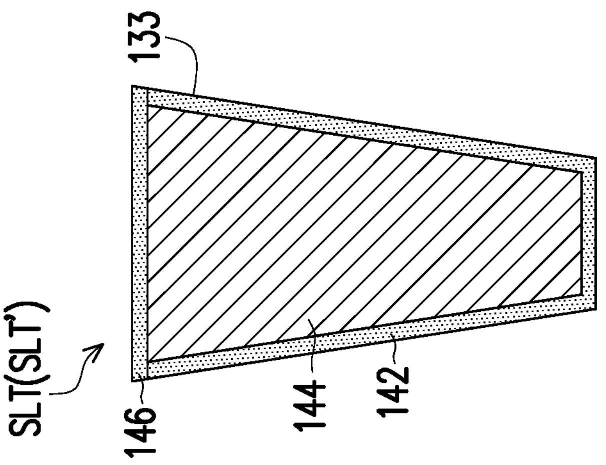

Referring to FIG. 3D, FIG. 4D and FIG. 5A, in some embodiments, the method of forming the separation structure SLT or SLT' is described as follows. An insulating liner material and a conductive material are filled on the gate stacked structure GSK and in the separation trenches 133. The insulating liner material may include silicon oxide. The conductive material may include polysilicon. Then, excess insulating liner material and conductive material on the gate stacked structure GSK and the edge region ER are removed through an etching back process or a planarization process, so as to form a liner layer 142 and a conductive layer 144. Afterwards, a dielectric material is formed on the substrate 48, and then an etching back process or a planarization process may be performed to planarize the dielectric material to form a dielectric layer 146. The liner layer 142, the conductive layer 144 and a part of the dielectric layer 146 form the separation structure SLT or SLT', as shown in FIG. 5A.

In some embodiments, the separation structure SLT or SLT' may also be completely filled with an insulating material 142', without any conductive material, as shown in FIG. 5B. In some other embodiments, the separation structure SLT or SLT' may include a liner 142 covering an air gap AG, without any conductive material, as shown in FIG. 5C.

Figure 3E:
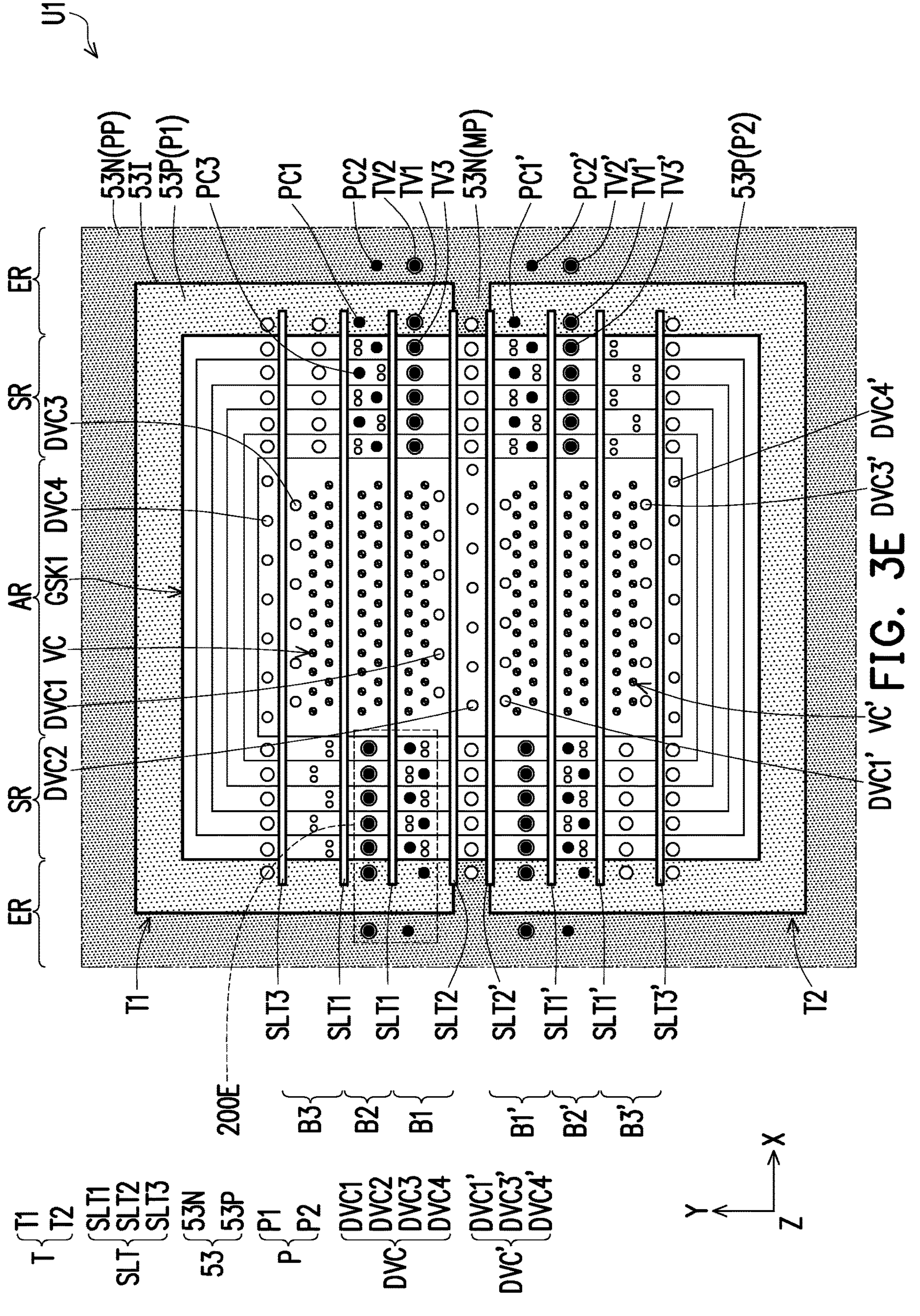
Figure 4E:
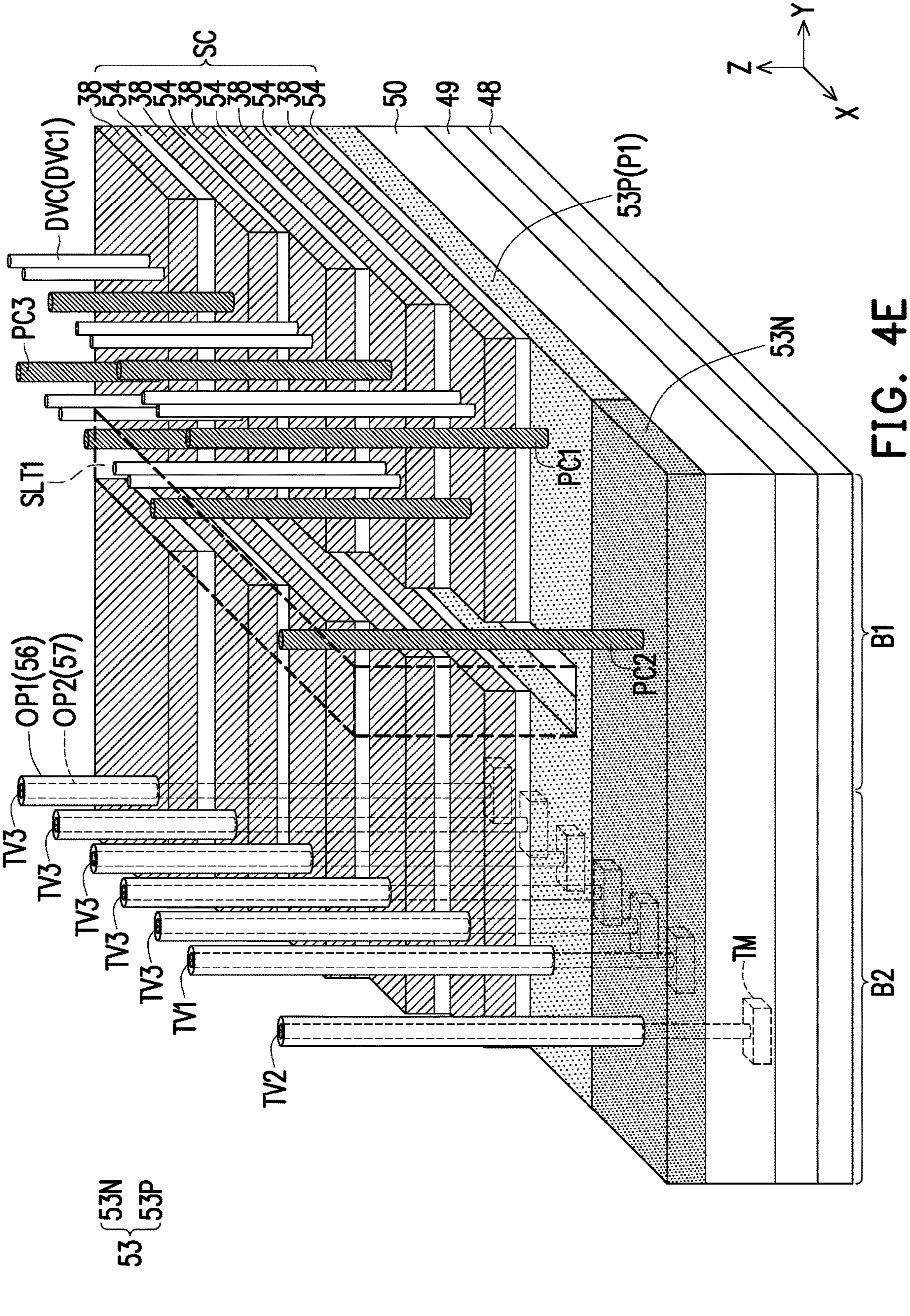

Referring to FIG. 3E and FIG. 4E, conductive vias 57 (shown in FIG. 4E) are formed in the insulating layer 56 of the through vias TV1, TV2, TV3 and TV1', TV2', TV3', and conductive plugs PC1, PC2, PC3 and PC1', PC2', PC3' are formed. The conductive vias 57 are located in the insulating layer 56 and extend through the insulating layer 56 and the dielectric layer 50, landed on and electrically connected to the topmost conductive layer TM of the interconnection structure 49. The conductive plugs PC1/PC1', PC2/PC2' and PC3/PC3' are respectively landed on the first conductive type doping layer 53P, the second conductive type doping layer 53N and the conductive layers 38. The method for forming the conductive vias 57 includes performing lithography and etching processes to form multiple second opening OP2 in the insulating layer 56. The second openings OP2 penetrate through the insulating layer 56 and the dielectric layer 50, exposing the topmost conductive layer TM of the interconnection structure 49. Next, a conductive material is formed on the substrate 48, and the conductive material is filled in the second openings OP2. The conductive material may include tungsten or polysilicon. Afterwards, a planarization process such as a chemical mechanical polishing process is performed to remove the conductive material outside the via holes. The conductive plugs PC1/PC1', PC2/PC2' and PC3/PC3' may be formed by a method similar to that of the conductive via 57 or any known method.

Referring to FIG. 2C and FIG. 2D, another dielectric layer (not shown) and a conductive layer are formed on the through vias TV1, TV2, TV3, TV1', TV2', and TV3' and the conductive plugs PC1, PC2, PC3, PC1', PC2', and PC3', and photolithography and etching processes are performed to pattern the conductive layer, to form conductive lines CL1, CL2, and CL3. In this embodiment, the conductive lines CL1, CL2, CL3 extend along the same direction. In another embodiment, the conductive lines CL1, CL2, CL3 extend along different directions.

In addition to being used in 3D AND flash memory, the present disclosure may also be used in 3D NOR flash memory and 3D NAND flash memory. The structure of the 3D NOR flash memory may be shown in FIG. 2A and FIG.

Figure 6B:
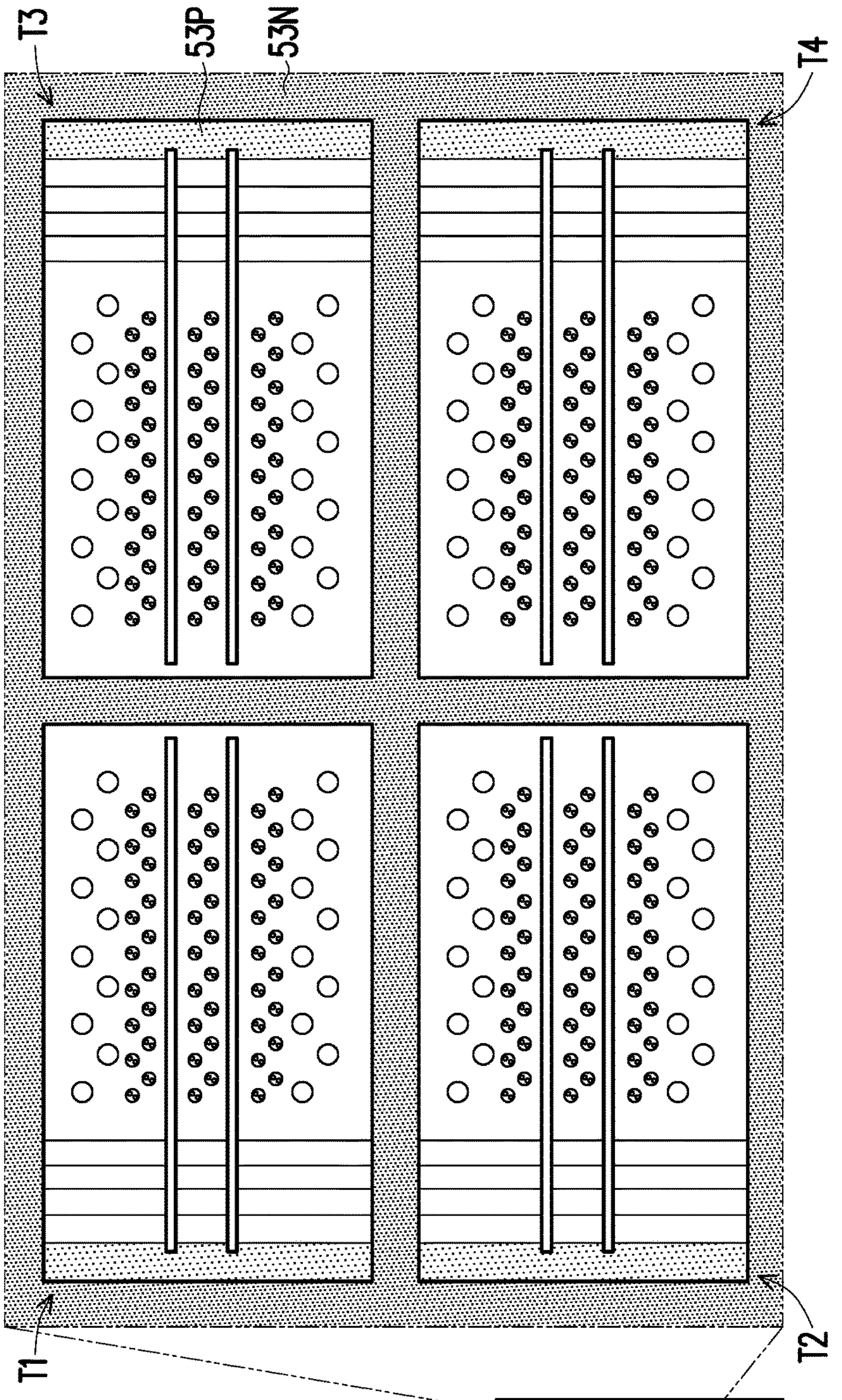
FIG. 6B is a top view of a partial area of FIG. 6A.
Figure 6A:
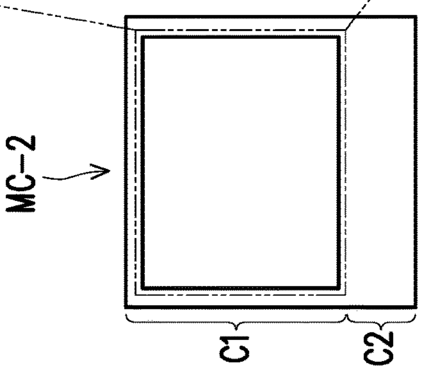
FIG. 6A is a top view of a memory die according to another embodiment of the present disclosure.

2B. The die MC-2 of the 3D NAND flash memory may be shown in FIG. 6A and FIG. 6B. In addition, the present disclosure may be applied to various flash memories, for example, floating gate (FG) type, charge trap (CT) type, CMOS near array type, CMOS under array type and CMOS bonding array type.

In view of the above, in the embodiments of the present disclosure, the first conductive type doping layer and the second conductive type doping layer are formed under the stacked structure to form a hetero-junction (PN junction) therebetween. By applying a voltage, the hetero-junction is non-conductive and thus a leakage current of memory devices is reduced. Therefore, the reliability of the device may be improved by using the methods of the embodiments of the present disclosure.

What is claimed is:

1. A memory device, comprising:

a stacked structure, located above a substrate, wherein the stacked structure comprises a plurality of conductive layers and a plurality of insulating layers alternately stacked;

a first conductive type doping layer, located between the stacked structure and the substrate, a projection area of the first conductive type doping layer being larger than a projection area of the stacked structure;

a second conductive type doping layer, surrounding the first conductive type doping layer and forming a hetero-junction with the first conductive type doping layer;

a first conductive plug, electrically connected to the first conductive type doping layer; and a second conductive plug, electrically connected to the second conductive type doping layer.

2. The memory device according to claim 1, further comprising:

a first through via, located outside the stacked structure, passing through the first conductive type doping layer, and electrically connected to a first device above the substrate; and a first conductive line, connecting the first conductive plug and the first through via, wherein the first conductive type doping layer is electrically connected to the first device through the first conductive plug, the first conductive line and the first through via.

3. The memory device according to claim 1, further comprising:

a second through via, located outside the first conductive type doping layer, passing through the second conductive type doping layer, and electrically connected to a second device above the substrate; and a second conductive line, connecting the second conductive plug and the second through via, wherein the second conductive type doping layer is electrically connected to the second device through the second conductive plug, the second conductive line and the second through via.

4. The memory device according to claim 1, further comprising: a first separation wall extending through the stacked structure and the first conductive type doping layer, and dividing the stacked structure into a first block and a second block.

5. The memory device according to claim 4, further comprising:

a third conductive plug, located on a staircase region of the first block of the stacked structure and connected to one of the plurality of conductive layers;

a third through via, located on a staircase region of the second block of the stacked structure, passing through the stacked structure, and connected to a third device above the substrate; and a third conductive line, connecting the third conductive plug and the third through via, wherein one of the plurality of conductive layers connects to the third device through the third conductive plug, the third conductive line and the third through via.

6. The memory device according to claim 5, further comprising:

a second separation wall, extending through the stacked structure and located between the first conductive type doping layer and the second conductive type doping layer; and a third separation wall, extending through the stacked structure and the first conductive type doping layer, wherein the first separation wall is located between the second separation wall and the third separation wall.

7. The memory device according to claim 6, wherein the first separation wall and the third separation wall are separated and not connected.

8. The memory device according to claim 6, wherein the first separation wall, the second separation wall and the third separation wall are parallel.

9. The memory device according to claim 6, further comprising:

a plurality of first channel pillar structures and a plurality of second channel pillar structures, extending through the stacked structure of the first block and the second block respectively, and separated by the first separation wall.

10. The memory device according to claim 6, further comprising:

a plurality of first dummy pillars, extending through the stacked structure above the first conductive type doping layer; and a plurality of second dummy pillars, extending through the stacked structure above the second conductive type doping layer, wherein the plurality of first dummy pillars and the plurality of second dummy pillars are separated by the second separation wall.

11. The memory device according to claim 10, further comprising:

a plurality of third dummy pillars, extending through the stacked structure above the first conductive type doping layer; and a plurality of fourth dummy pillars, extending through the stacked structure above the first conductive type doping layer, wherein the plurality of third dummy pillars and the plurality of fourth dummy pillars are separated by the third separation wall.

12. A memory device, comprising:

a first conductive type doping layer, located above a substrate and comprising a first portion and a second portion separated from each other;

a second conductive type doping layer, located above the substrate, surrounding the first portion and the second portion, wherein the second conductive type doping layer comprises:

a middle portion, located between the first portion and the second portion of the first conductive type doping layer;

a peripheral portion, surrounding the first portion and the second portion of the first conductive type doping layer;

a stacked structure, located above the first portion of the first conductive type doping layer, above the middle portion of the second conductive type doping layer, and above the second portion of the first conductive type doping layer, wherein the stacked structure comprises a plurality of conductive layers and a plurality of insulating layers alternately stacked; and a pair of middle separation walls, extending through the stacked structure, wherein a side of a first middle separation wall of the pair of middle separation walls is located adjacent to the first portion of the first conductive type doping layer, a side of a second middle separation wall of the pair of middle separation walls is located adjacent to the second portion of the first conductive type doping layer, and another side of the first middle separation wall and another side of the second middle separation wall are located adjacent to the middle portion of the second conductive type doping layer.

13. The memory device according to claim 12, further comprising:

a first outer separation wall, extending through the stacked structure and extending to the first portion of the first conductive type doping layer; and a second outer separation wall, extending through the stacked structure and extending to the second portion of the first conductive type doping layer, wherein the first outer separation wall and the first middle separation wall define a first tile of the stacked structure, the first outer separation wall and the first middle separation wall are separated from each other and not connected, the second outer separation wall and the second middle separation wall define a second tile of the stacked structure, and the second outer separation wall and the second middle separation wall are separated from each other and not connected.

14. The memory device according to claim 12, further comprising:

a plurality of first conductive plugs, located outside the stacked structure and respectively landing on the first portion and the second portion of the first conductive type doping layer; and a second conductive plug, located outside the first conductive type doping layer and landing on the second conductive type doping layer.

15. The memory device according to claim 14, further comprising:

a plurality of first through vias, located outside the stacked structure, passing through the first portion and the second portion of the first conductive type doping layer, and electrically connected to a plurality of first devices above the substrate respectively; and a plurality of first conductive lines, connecting the plurality of first conductive plugs and the plurality of first through vias, wherein the first portion and the second portion of the first conductive type doping layer are electrically connected to the corresponding first device through the corresponding first conductive plug, the corresponding first conductive line and the corresponding first through via respectively.

16. The memory device according to claim 14, further comprising:

a second through via, located outside the first conductive type doping layer, passing through the peripheral portion of the second conductive type doping layer, and electrically connected to a second device above the substrate; and a second conductive line, connecting the second conductive plug and the second through via, wherein the second conductive type doping layer is electrically connected to the second device through the second conductive plug, the second conductive line and the second through via.

17. The memory device according to claim 12, wherein the first portion of the first conductive type doping layer is continuous, and the second portion of the first conductive type doping layer is continuous.

18. The memory device according to claim 12, wherein the middle portion and the peripheral portion of the second conductive type doping layer are respectively continuous and connected to each other.

* * * * *